US011929381B2

(12) United States Patent
Kim et al.

(10) Patent No.: US 11,929,381 B2
(45) Date of Patent: Mar. 12, 2024

(54) IMAGE SENSOR AND A METHOD OF FABRICATING THE SAME

(71) Applicant: SAMSUNG ELECTRONICS CO., LTD., Suwon-si (KR)

(72) Inventors: Han Seok Kim, Seoul (KR); Byung Jun Park, Yongin-si (KR); Jin Ju Jeon, Yongin-si (KR); Hee Geun Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 405 days.

(21) Appl. No.: 17/138,112

(22) Filed: Dec. 30, 2020

(65) Prior Publication Data

US 2021/0335877 A1    Oct. 28, 2021

(30) Foreign Application Priority Data

Apr. 24, 2020    (KR) .................. 10-2020-0050140

(51) Int. Cl.
*H01L 27/14*    (2006.01)
*H01L 27/146*    (2006.01)

(52) U.S. Cl.
CPC .. *H01L 27/14643* (2013.01); *H01L 27/14612* (2013.01); *H01L 27/14621* (2013.01); *H01L 27/1464* (2013.01); *H01L 27/14685* (2013.01); *H01L 27/14689* (2013.01)

(58) Field of Classification Search
CPC ......... H01L 27/14643; H01L 27/14612; H01L 27/14621; H01L 27/1464; H01L 27/14685; H01L 27/14689
See application file for complete search history.

(56) References Cited

U.S. PATENT DOCUMENTS

| 9,748,296 | B2 | 8/2017 | Enomoto et al. |
| 10,153,316 | B2 | 12/2018 | Lin et al. |
| 10,510,788 | B2 | 12/2019 | Chou et al. |
| 10,510,797 | B2 | 12/2019 | Chiang et al. |
| 10,811,453 | B1 * | 10/2020 | Mun .................. H01L 27/1464 |
| 2012/0261781 | A1 * | 10/2012 | Hsu .................. H01L 27/14627 |
| | | | 257/E31.127 |

(Continued)

FOREIGN PATENT DOCUMENTS

KR    10-1638183    7/2016

*Primary Examiner* — Ali Naraghi
*Assistant Examiner* — Siangluai Mang
(74) *Attorney, Agent, or Firm* — F. Chau & Associates, LLC

(57) ABSTRACT

An image sensor including: a substrate which includes a first surface and a second surface opposite each other; a plurality of pixels, each pixel including a photoelectric conversion layer in the substrate; a pixel separation pattern disposed in the substrate and separating the pixels; a surface insulating layer disposed on the first surface of the substrate; conductor contacts disposed in the surface insulating layer; and a grid pattern disposed on the surface insulating layer, wherein the pixel separation pattern includes a first portion and a second portion arranged in a direction parallel to the first surface of the substrate, and the conductor contacts are interposed between the first portion of the pixel separation pattern and the grid pattern and are not interposed between the second portion of the pixel separation pattern and the grid pattern.

14 Claims, 36 Drawing Sheets

(56) References Cited

U.S. PATENT DOCUMENTS

| | | | |
|---|---|---|---|
| 2014/0246707 A1* | 9/2014 | Koo | H01L 27/14689 |
| | | | 257/230 |
| 2016/0172394 A1* | 6/2016 | Lee | H01L 27/1463 |
| | | | 257/432 |
| 2017/0047363 A1* | 2/2017 | Choi | H01L 27/1464 |
| 2018/0090538 A1* | 3/2018 | Wang | H01L 27/14621 |
| 2018/0175091 A1* | 6/2018 | Jeon | H01L 27/14641 |
| 2018/0197904 A1* | 7/2018 | Oh | H01L 27/1463 |
| 2019/0148434 A1 | 5/2019 | Hsu | |
| 2019/0198547 A1* | 6/2019 | Yoshigiwa | H01L 27/1463 |
| 2019/0259797 A1 | 8/2019 | Li et al. | |
| 2019/0267413 A1 | 8/2019 | Kim et al. | |
| 2019/0296060 A1 | 9/2019 | Oh | |
| 2022/0181374 A1* | 6/2022 | Ito | H01L 27/14643 |

\* cited by examiner

IMAGE SENSOR AND A METHOD OF FABRICATING THE SAME

This application claims priority under 35 U.S.C. § 119 to Korean Patent Application No. 10-2020-0050140, filed on Apr. 24, 2020, in the Korean Intellectual Property Office, the disclosure of which is incorporated by reference herein in its entirety.

1. TECHNICAL FIELD

The present inventive concept relates to an image sensor and a method of fabricating the same, and more particularly, to an image sensor including a grid pattern and a method of fabricating the image sensor.

2. DESCRIPTION OF THE RELATED ART

An image sensor is a semiconductor device that converts optical information into an electrical signal. For example, an image sensor may convert the variable attenuation of light waves into signals, i.e., small bursts of current that convey the information. Such image sensors may include charge coupled device (CCD) image sensors and complementary metal-oxide semiconductor (CMOS) image sensors.

An image sensor may be configured in the form of a package. The package may protect the image sensor and include a photo receiving surface or a sensing area. In this case, light can be incident on the photo receiving surface or the sensing area.

The image sensor may further be provided as a backside illumination (BSI) image sensor in which incident light is illuminated through a back side of a semiconductor substrate. This configuration can increase the amount of light captured and thereby improve the low-light performance of the image sensor.

SUMMARY

According to an exemplary embodiment of the inventive concept, there is provided an image sensor including: a substrate which includes a first surface and a second surface opposite each other; a plurality of pixels, each pixel including a photoelectric conversion layer in the substrate; a pixel separation pattern disposed in the substrate and separating the pixels; a surface insulating layer disposed on the first surface of the substrate; conductor contacts disposed in the surface insulating layer; and a grid pattern disposed on the surface insulating layer, wherein the pixel separation pattern includes a first portion and a second portion arranged in a direction parallel to the first surface of the substrate, and the conductor contacts are interposed between the first portion of the pixel separation pattern and the grid pattern and are not interposed between the second portion of the pixel separation pattern and the grid pattern.

According to an exemplary embodiment of the inventive concept, there is provided an image sensor including: a substrate which includes a first pixel, a second pixel adjacent to the first pixel in a first direction, and a third pixel adjacent to the first pixel in a second direction intersecting the first direction; a pixel separation pattern which is formed in the substrate to separate the first pixel, the second pixel and the third pixel from each other; a surface insulating layer which is formed on the substrate and the pixel separation pattern; a conductor contact which is formed in the surface insulating layer and disposed on the pixel separation pattern between the second pixel and the third pixel; and a grid pattern which is disposed on the surface insulating layer to overlap the pixel separation pattern.

According to an exemplary embodiment of the inventive concept, there is provided an image sensor including: a first substrate including a first surface on which light is incident and a second surface which is opposite the first surface; a plurality of pixels, each pixel including a photoelectric conversion layer in the first substrate; a pixel separation pattern which is formed in a grid shape in the first substrate and separates the pixels; a first wiring structure which is formed on the second surface of the first substrate and includes a first inter-wiring insulating layer and a first wiring formed in the inter-wiring insulating layer; a surface insulating layer which extends along the first surface of the first substrate; conductor contacts which are formed in the surface insulating layer to overlap grid points of the pixel separation pattern; a plurality of color filters which are formed on the surface insulating layer to correspond to the pixels; a grid pattern which is formed on the surface insulating layer in a grid shape and interposed between the color filters; and a microlens which is disposed on each of the color filters.

According to an exemplary embodiment of the inventive concept, there is provided a method of fabricating an image sensor, the method including: providing a first substrate which includes a plurality of pixels, each pixel including a photoelectric conversion layer, and the first substrate includes a first surface and a second surface opposite each other; forming a pixel separation pattern, which separates the pixels, in the first substrate with a grid shape; forming a surface insulting layer along the first surface of the first substrate; forming conductor contacts in the surface insulating layer to overlap grid points of the pixel separation pattern; and forming a grid pattern on the surface insulating layer in a grid shape to overlap the pixel separation pattern.

According to an exemplary embodiment of the inventive concept, there is provided an image sensor including: a plurality of pixels arranged in a matrix in a substrate; a separation pattern disposed between the pixels in the substrate; an insulating layer disposed on the substrate; a grid pattern disposed on the insulating layer, the grid pattern corresponding to the separation pattern; and conductive contacts disposed between the grid pattern and the separation pattern in a first portion of a light receiving area and wherein a second portion of the light receiving area does not include a conductive contact.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Image sensors according to exemplary embodiments of the inventive concept will now be described with reference to FIGS. 1A through 14.

Figure 1A:
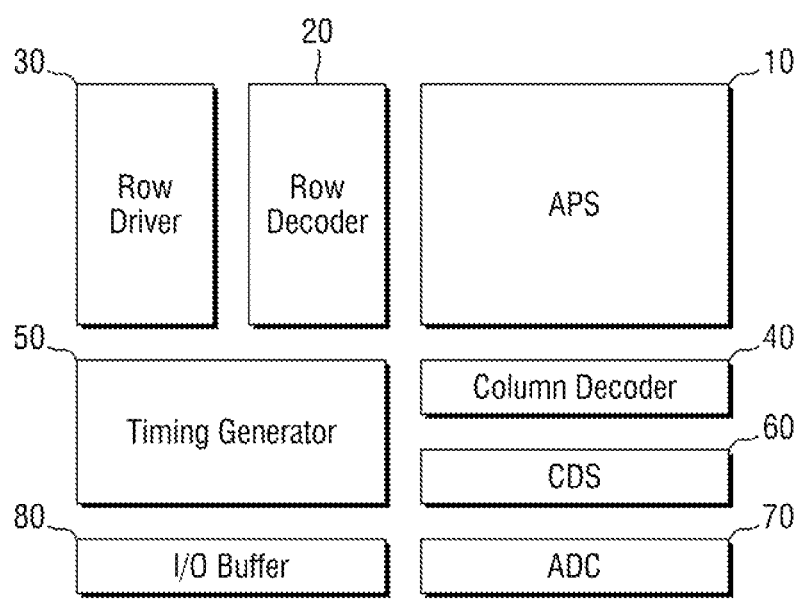
FIG. 1A is a block diagram of an image sensor according to exemplary embodiments of the inventive concept.
Figure 1B:
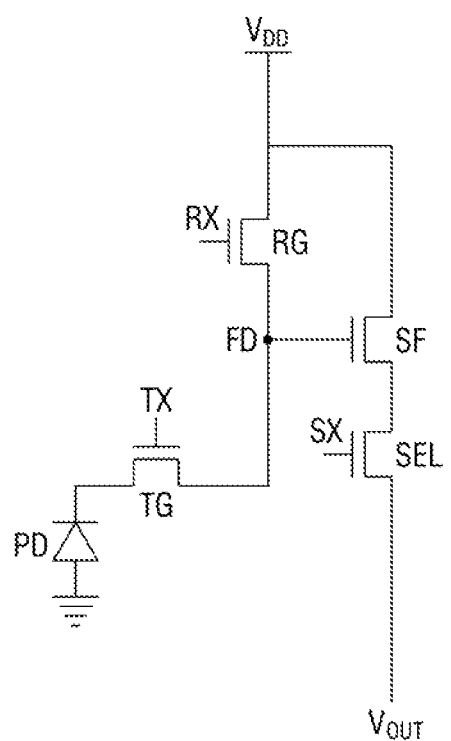
FIG. 1B is a circuit diagram of a unit pixel of the image sensor of FIG. 1A according to exemplary embodiments of the inventive concept.

FIG. 1A is a block diagram of an image sensor according to exemplary embodiments of the inventive concept. FIG. 1B is a circuit diagram of a unit pixel of the image sensor of the FIG. 1A according to exemplary embodiments of the inventive concept.

Referring to FIG. 1A, the image sensor according to the exemplary embodiments of the inventive concept may include an active pixel sensor (APS) array 10, a row decoder 20, a row driver 30, a column decoder 40, a timing generator 50, a correlated double sampler (CDS) 60, an analog-to-digital converter (ADC) 70, and an input/output (I/O) buffer 80.

The APS array 10 may include a plurality of unit pixels arranged in two dimensions and may convert optical signals into electrical signals. For example, the pixels may be arranged in a matrix form. The APS array 10 may be driven by a plurality of driving signals such as a pixel selection signal, a reset signal, and a charge transfer signal received from the row driver 30. In addition, the electrical signals output from the APS array 10 may be provided to the CDS 60.

The row driver 30 may provide a plurality of driving signals for driving a plurality of unit pixels to the APS array 10 according to the decoding result of the row decoder 20. When the unit pixels are arranged in a matrix, the driving signals may be provided to each row.

The timing generator 50 may provide a timing signal and a control signal to the row decoder 20 and the column decoder 40.

The CDS 60 may receive the electrical signals generated by the APS array 10 and hold and sample the received electrical signals. The CDS 60 may double-sample a specific noise level and signal levels of the electrical signals and output difference levels (e.g., differences) between the noise level and the signal levels.

The ADC 70 may convert analog signals corresponding to the difference levels output from the CDS 60 into digital signals and output the digital signals.

The I/O buffer 80 may latch the digital signals and sequentially output the latched signals to an image signal processor according to the decoding result of the column decoder 40.

Referring to FIG. 1B, each unit pixel may include a photoelectric conversion layer PD, a transfer transistor TG, a floating diffusion region FD, a reset transistor RG, a source follower transistor SF, and a selection transistor SEL.

The photoelectric conversion layer PD may generate charges in proportion to the amount of light incident from the outside. The photoelectric conversion layer PD may be coupled to the transfer transistor TG that transfers generated and accumulated charges to the floating diffusion region FD. The floating diffusion region FD is a region that converts charges into a voltage and may cumulatively store charges due to its parasitic capacitance.

An end (e.g., a first electrode) of the transfer transistor TG may be connected to the photoelectric conversion layer PD, and the other end (e.g., a second electrode) of the transfer transistor TG may be connected to the floating diffusion region FD. The transfer transistor TG may be a transistor that is driven by a predetermined bias (e.g., a transfer signal TX). In other words, the transfer transistor TG may transfer charges generated by the photoelectric conversion layer PD to the floating diffusion region FD according to the transfer signal TX.

The source follower transistor SF may amplify a change in an electric potential of the floating diffusion region FD which receives charges from the photoelectric conversion layer PD and may output the amplified change to an output line $V_{out}$. When the source follower transistor SF is turned on, a predetermined electric potential provided to a drain of the source follower transistor SF, for example, a power supply voltage $V_{DD}$, may be transferred to a drain region of the selection transistor SEL.

The selection transistor SEL may select unit pixels to be read on a row-by-row basis. The selection transistor SEL may be a transistor driven by a selection line which applies a predetermined bias (e.g., a row selection signal SX).

The reset transistor RG may periodically reset the floating diffusion region FD. The reset transistor RG may be driven by a reset line which applies a predetermined bias (e.g., a reset signal RX). When the reset transistor RG is turned on by the reset signal RX, a predetermined electric potential provided to a drain of the reset transistor RG, for example, the power supply voltage $V_{DD}$ may be transferred to the floating diffusion region FD.

Figure 2:
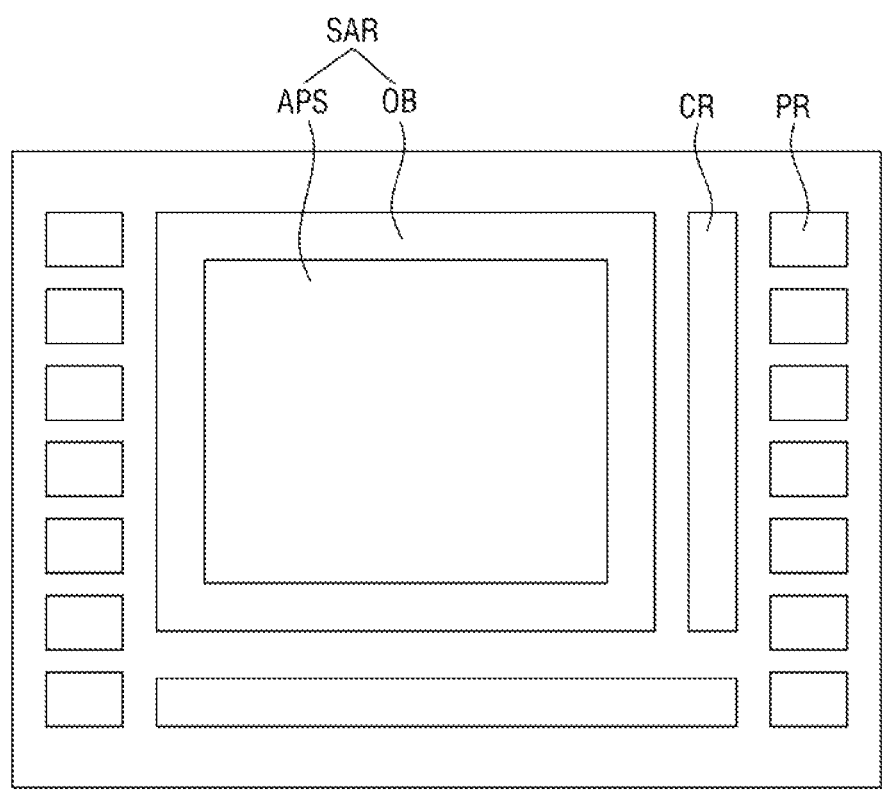
FIG. 2 is a layout view of an image sensor according to exemplary embodiments of the inventive concept.

FIG. 2 is an example layout view of an image sensor according to exemplary embodiments of the inventive concept.

Referring to FIG. 2, the image sensor according to the exemplary embodiments of the inventive concept may include a sensor array region SAR, a connection region CR, and a pad region PR.

The sensor array region SAR may include a region corresponding to the APS array 10 of FIG. 1A. For example, a plurality of unit pixels arranged in two dimensions (e.g., in a matrix) may be formed in the sensor array region SAR.

The sensor array region SAR may include a light receiving region APS and a light blocking region OB. In the light receiving region APS, active pixels that receive light and generate active signals may be arranged. In the light blocking region OB, optical black pixels that block light and generate optical black signals may be arranged. The light blocking region OB may be formed, for example, around the light receiving region APS, but this is merely an example.

In some exemplary embodiments of the inventive concept, dummy pixels may be formed in the light receiving region APS adjacent to the light blocking region OB.

The connection region CR may be formed near the sensor array region SAR. The connection region CR may be formed on a side of the sensor array region SAR, but this is merely an example. Wirings may be formed in the connection region CR and configured to transmit and receive electrical signals of the sensor array region SAR.

The pad region PR may be formed near the sensor array region SAR. The pad region PR may be formed adjacent to edges of the image sensor, but this is merely an example. The pad region PR may be connected to an external device or the like and configured to transmit and receive electrical signals between the image sensor and the external device.

In FIG. 2, the connection region CR is interposed between the sensor array region SAR and the pad region PR, but this is merely an example. The arrangement of the sensor array region SAR, the connection region CR, and the pad region PR may be variously changed.

Figure 3:
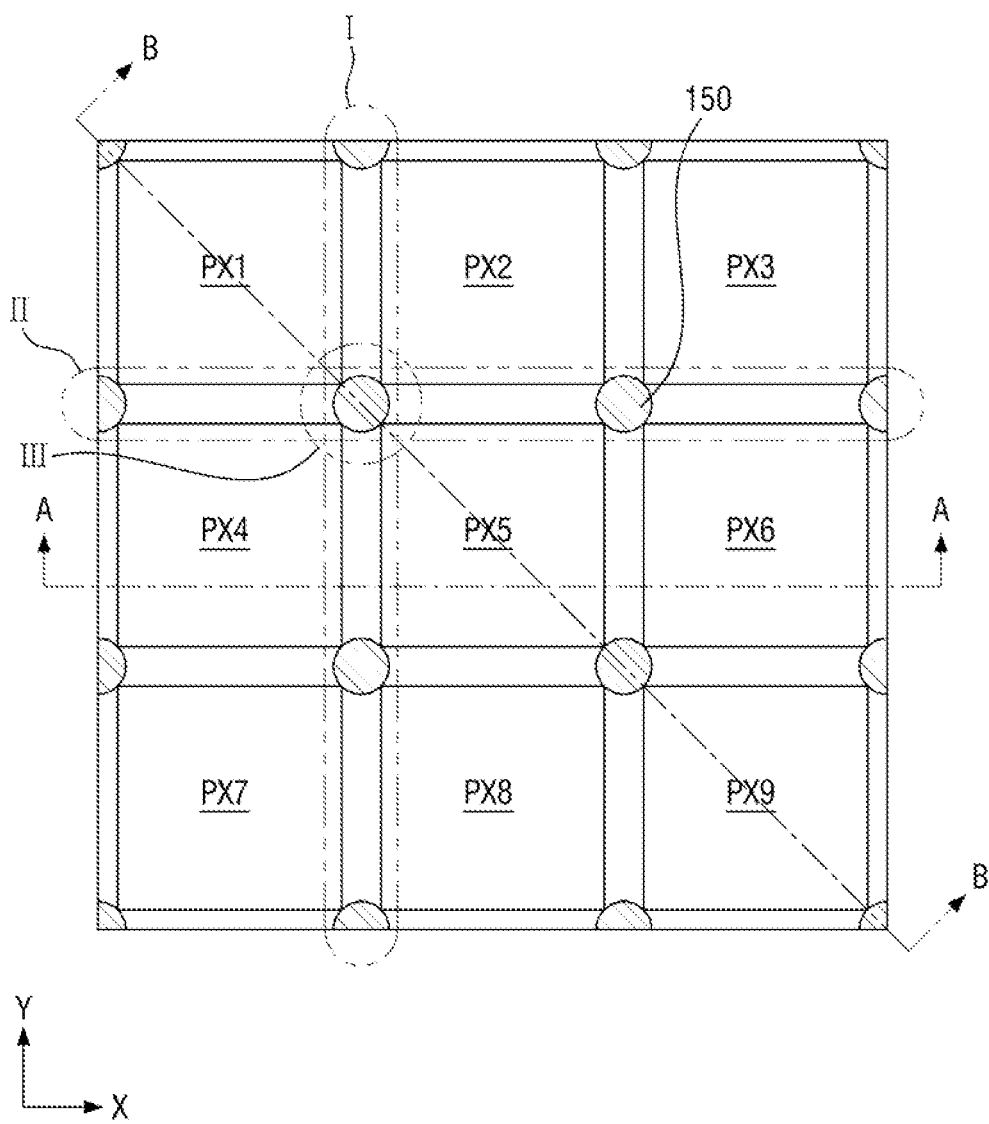
FIG. 3 is a layout view of a part of a light receiving region APS of FIG. 2.
Figure 4:
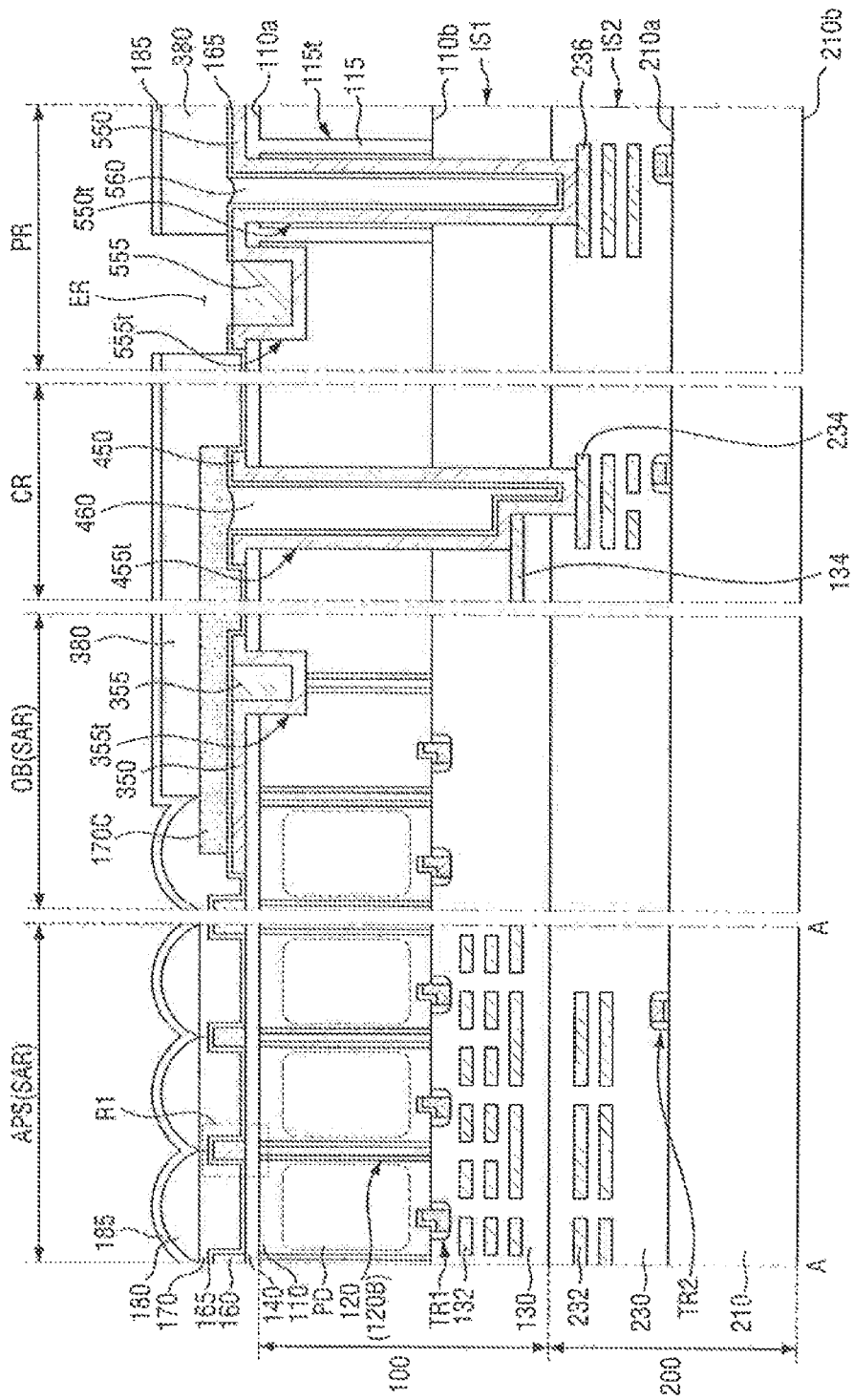
FIG. 4 is a cross-sectional view taken along line A-A of FIG. 3 and cross-sectional views of a light blocking region OB, a connection region CR and a pad region PR of FIG. 2.
Figure 5:
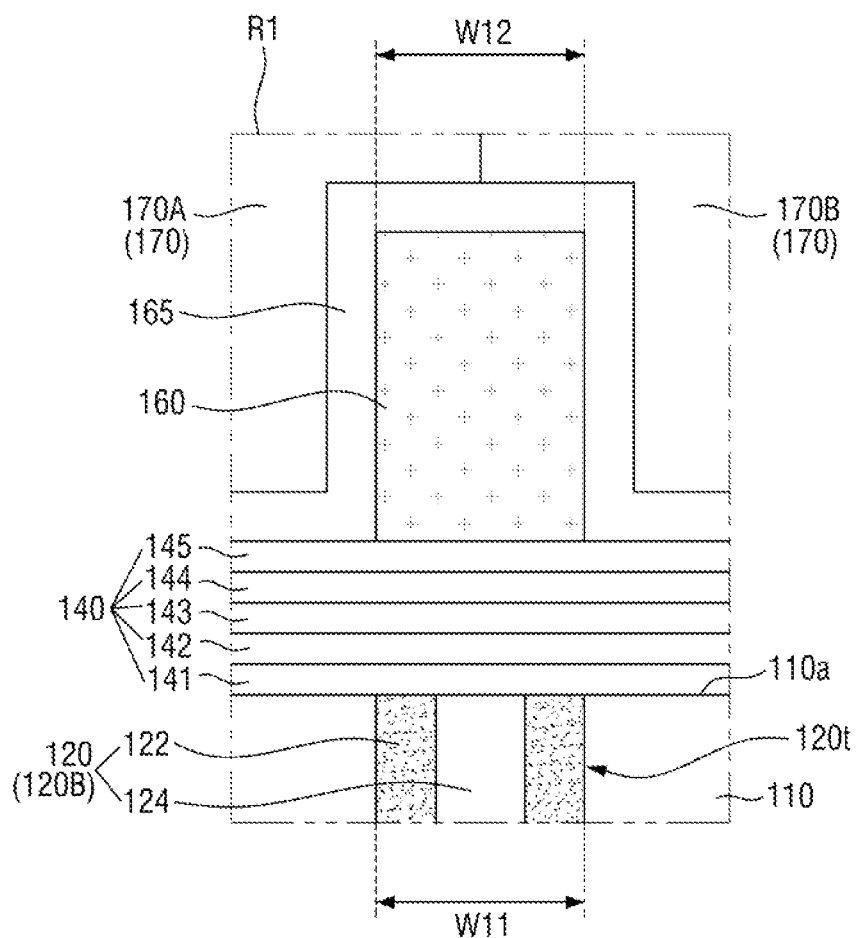
FIG. 5 is an enlarged view of region R1 of FIG. 4.
Figure 6:
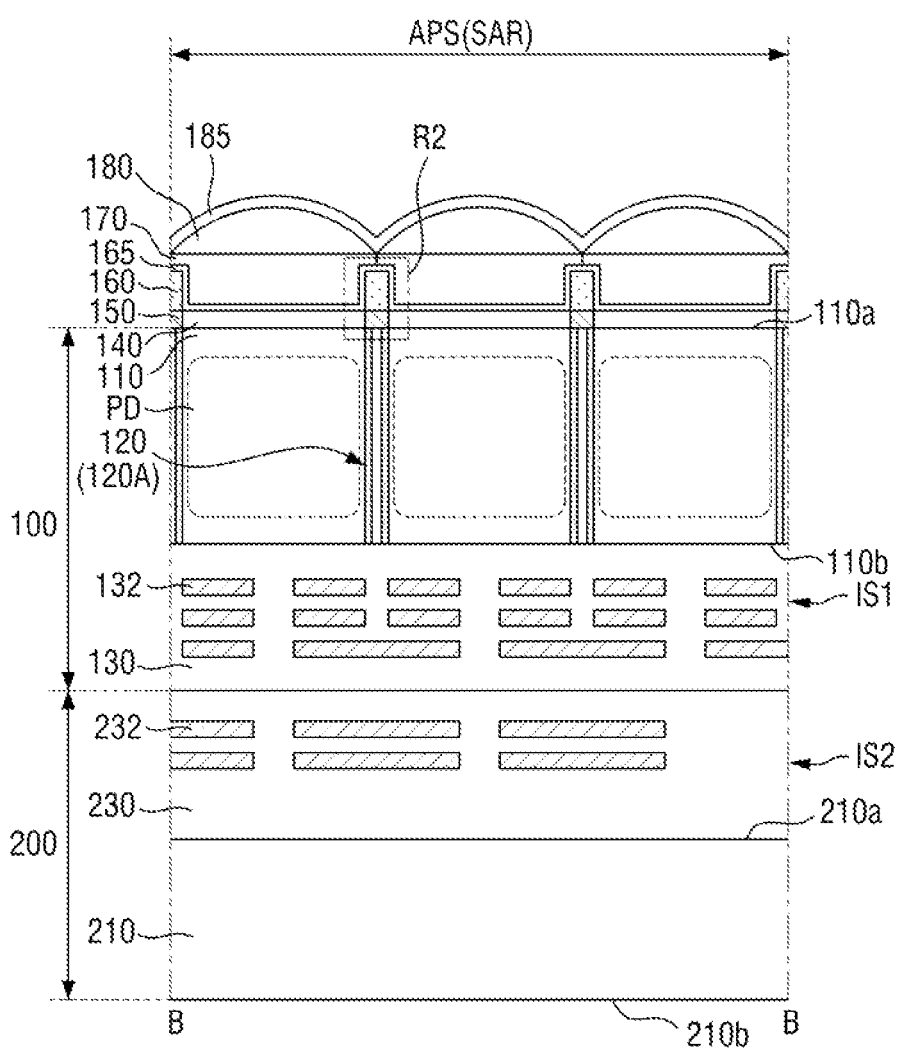
FIG. 6 is a cross-sectional view taken along line B-B of FIG. 3.

FIG. 3 is a layout view of a part of the light receiving region APS of FIG. 2. FIG. 4 is a cross-sectional view taken along line A-A of FIG. 3 and cross-sectional views of the light blocking region OB, the connection region CR and the pad region PR of FIG. 2. FIG. 5 is an enlarged view of region R1 of FIG. 4. FIG. 6 is a cross-sectional view taken along line B-B of FIG. 3. FIGS. 7A through 7H are various enlarged views of region R2 of FIG. 6.

Referring to FIGS. 3 through 7H, the image sensor according to the exemplary embodiments of the inventive concept includes a first substrate 110, a pixel separation pattern 120, a first wiring structure IS1, a second substrate 210, a second wiring structure IS2, a surface insulating layer 140, conductor contacts 150, color filters 170, a grid pattern 160, and microlenses 180.

The first substrate 110 may be a semiconductor substrate. For example, the first substrate 110 may be bulk silicon or silicon-on-insulator (SOI). The first substrate 110 may be a silicon substrate or a substrate made of another material such as silicon germanium, indium antimonide, lead telluride, indium arsenide, indium phosphide, gallium arsenide, or gallium antimonide. Alternatively, the first substrate 110 may include a base substrate and an epitaxial layer formed on the base substrate.

The first substrate 110 may include a first surface 110a and a second surface 110b which are opposite each other. In exemplary embodiments of the inventive concept to be described later, the first surface 110a may be referred to as a back side of the first substrate 110, and the second surface 110b may be referred to as a front side of the first substrate 110. In some exemplary embodiments of the inventive concept, the first surface 110a of the first substrate 110 may be a photo receiving surface on which light is incident. In other words, the image sensor according to the exemplary embodiments of the inventive concept may be a backside illumination (BSI) image sensor.

A plurality of unit pixels may be formed in the first substrate 110 of the sensor array region SAR. For example, as illustrated in FIG. 3, a plurality of pixels PX1, PX2, PX3, PX4, PX5, PX6, PX7, PX8 and PX9 arranged in two dimensions (e.g., in a matrix) in a plane including a first direction X and a second direction Y may be formed in the light receiving region APS.

Each of the unit pixels may include a photoelectric conversion layer PD. The photoelectric conversion layer PD may be formed in the first substrate 110 of the light receiving region APS. The photoelectric conversion layer PD may generate charges in proportion to the amount of light incident from the outside. In some exemplary embodiments of the inventive concept, the photoelectric conversion layer PD may not be formed in a part of the light blocking region OB. For example, the photoelectric conversion layer PD may be formed in the first substrate 110 of the light blocking region OB adjacent to the light receiving region APS but may not be formed in the first substrate 110 of the light blocking region OB spaced apart from the light receiving region APS. In other words, the first substrate 110 of a portion of the light blocking region OB not adjacent to the light receiving region APS, may not include the photoelectric conversion layer PD.

The photoelectric conversion layer PD may include, but is not limited to, at least one of a photodiode, a phototransistor, a photogate, a pinned photodiode, an organic photodiode, quantum dots, and combinations of the same.

Each of the unit pixels may include a first electronic device TR1. In some exemplary embodiments of the inventive concept, the first electronic device TR1 may be formed on the second surface 110b of the first substrate 110. The first electronic device TR1 may be connected to the photoelectric conversion layer PD to form various transistors for processing electrical signals. For example, the first electronic device TR1 may form a transistor such as the transfer transistor TG, the reset transistor RG, the source follower transistor SF, or the selection transistor SEL described above with reference to FIG. 1B.

In some exemplary embodiments of the inventive concept, the first electronic device TR1 may include a vertical transfer transistor. For example, a part of the first electronic device TR1 that forms the transfer transistor TG described above may extend into the first substrate 110. The transfer transistor TG may reduce the area of a unit pixel, thereby enabling high integration of the image sensor.

The pixel separation pattern 120 may be formed in the first substrate 110 of the sensor array region SAR. The pixel separation pattern 120 may be, for example, formed by filling a deep trench (e.g., a first trench 120t of FIGS. 5 and 7A), which is formed by patterning the first substrate 110, with an insulating material.

The pixel separation pattern 120 may define the unit pixels. The pixel separation pattern 120 may be formed in a grid shape in a plan view to separate the pixels PX1 through PX9 from each other.

For example, as illustrated in FIG. 3, the light receiving region APS may include a plurality of first regions I extending in the second direction Y and a plurality of second regions II extending in the first direction X. A part of the pixel separation pattern 120 may be formed in the first regions I to separate pixels (e.g., a first pixel PX1 and a second pixel PX2 or the second pixel PX2 and a third pixel PX3) arranged along the first direction X. In addition, the other part of the pixel separation pattern 120 may be formed in the second regions II to separate pixels (e.g., the first pixel PX1 and a fourth pixel PX4 and the fourth pixel PX4 and a seventh pixel PX7) arranged along the second direction Y. Accordingly, the pixel separation pattern 120 may surround each of the pixels PX1 through PX9 in a plan view.

In some exemplary embodiments of the inventive concept, the pixel separation pattern 120 may penetrate the first substrate 110. For example, as illustrated in FIG. 4, the pixel separation pattern 120 may extend from the first surface 110a to the second surface 110b.

Figure 7A:
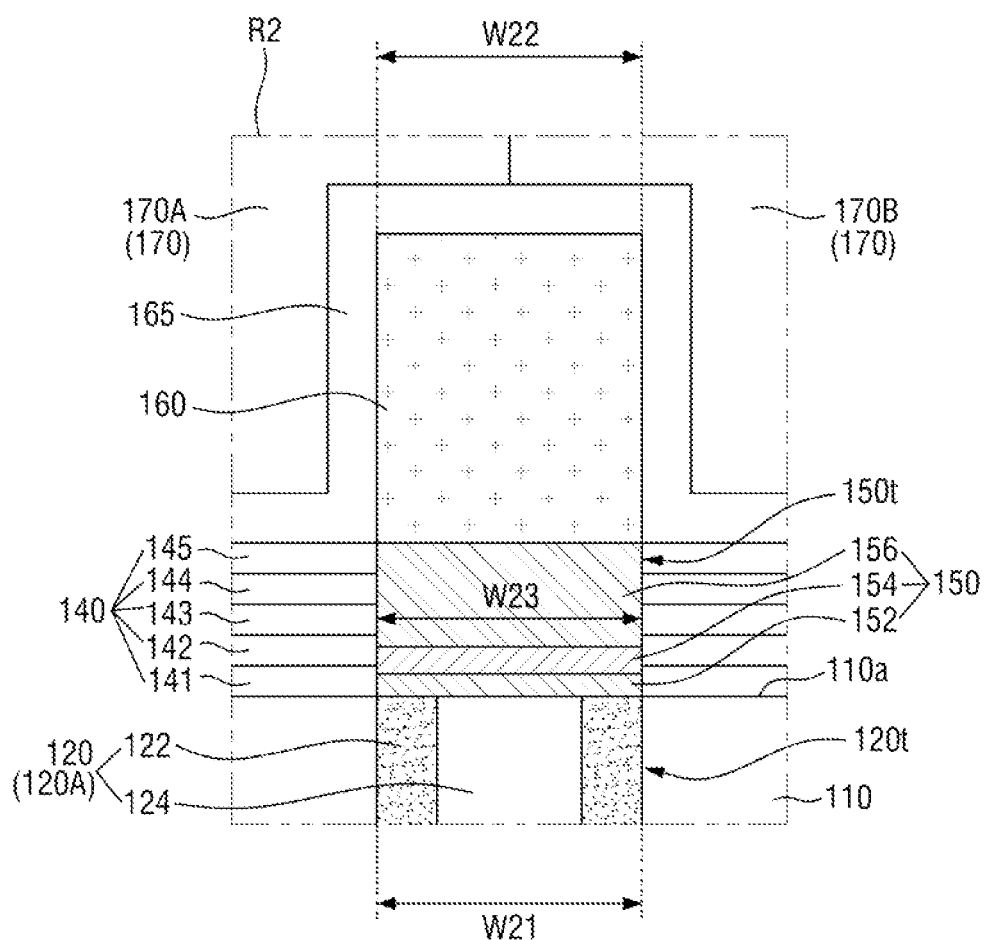
FIGS. 7A, 7B, 7C, 7D, 7E, 7F, 7G and 7H are various enlarged views of region R2 of FIG. 6.

In some exemplary embodiments of the inventive concept, the pixel separation pattern 120 may include an insulating spacer layer 122 and a filling conductive layer 124. For example, as illustrated in FIGS. 5 and 7A, the first trench 120*t* may be formed in the first substrate 110. The insulating spacer layer 122 may extend along side surfaces of the first trench 120*t*. The filling conductive layer 124 may be formed on the insulating spacer layer 122 to fill the remaining region of the first trench 120*t*. In other words, the first trench 120*t* may be filled with the insulating spacer layer 122 and the filling conductive layer 124.

In some exemplary embodiments of the inventive concept, the insulating spacer layer 122 may include an oxide layer having a refractive index lower than that of the first substrate 110. For example, the insulating spacer layer 122 may include, but is not limited to, at least one of silicon oxide, aluminum oxide, tantalum oxide, and combinations of the same. The insulating spacer layer 122 having a lower refractive index than the first substrate 110 may refract or reflect light obliquely incident on the photoelectric conversion layer PD. In addition, the insulating spacer layer 122 may prevent photocharges generated in a specific unit pixel by incident light from moving to an adjacent unit pixel through random drift. In other words, the insulating spacer layer 122 may increase a light reception rate of the photoelectric conversion layer PD, thereby increasing the quality of the image sensor according to the exemplary embodiments of the inventive concept.

In some exemplary embodiments of the inventive concept, the filling conductive layer 124 may include a conductive material. For example, the filling conductive layer 124 may include, but is not limited to, polysilicon. In some exemplary embodiments of the inventive concept, a ground voltage or a negative voltage may be applied to the filling conductive layer 124 including a conductive material. Accordingly, an electrostatic discharge (ESD) bruising defect of the image sensor according to the exemplary embodiments of the inventive concept can be effectively prevented. The ESD bruising defect may refer to a phenomenon in which charges generated by ESD or the like accumulate on a surface (e.g., the first surface 110*a*) of the substrate to generate a bruise-like stain on a generated image.

The first wiring structure IS1 may be formed on the first substrate 110. For example, the first wiring structure IS1 may cover the second surface 110*b* of the first substrate 110. The first substrate 110 and the first wiring structure IS1 may constitute a first substrate structure 100.

The first wiring structure IS1 may be composed of one or a plurality of wirings. For example, the first wiring structure IS1 may include a first inter-wiring insulating layer 130 and a plurality of wirings 132 and 134 formed in the first inter-wiring insulating layer 130. In FIG. 4, the number of layers and arrangement of wirings constituting the first wiring structure IS1 are merely an example. The first inter-wiring insulating layer 130 may include, but is not limited to, at least one of silicon oxide, silicon nitride, silicon oxynitride, and a low-k material having a lower dielectric constant than silicon oxide.

In some exemplary embodiments of the inventive concept, the first wiring structure IS1 may include first wirings 132 in the sensor array region SAR and a second wiring 134 in the connection region CR. The first wirings 132 may be electrically connected to the unit pixels of the sensor array region SAR. For example, the first wirings 132 may be connected to the first electronic devices TR1. The second wiring 134 may extend from the sensor array region SAR. For example, the second wiring 134 may be electrically connected to at least one of the first wirings 132. Accordingly, the second wiring 134 may be electrically connected to the unit pixels of the sensor array region SAR.

The first wiring 132 and the second wiring 134 may include, but are not limited to, at least one of tungsten (W), copper (Cu), aluminum (Al), gold (Au), silver (Ag), and alloys of the same.

The second substrate 210 may be bulk silicon or silicon-on-insulator (SOI). The second substrate 210 may be a silicon substrate or a substrate made of another material such as silicon germanium, indium antimonide, lead telluride, indium arsenide, indium phosphide, gallium arsenide, or gallium antimonide. Alternatively, the second substrate 210 may include a base substrate and an epitaxial layer formed on the base substrate.

The second substrate 210 may include a third surface 210*a* and a fourth surface 210*b* which are opposite each other. In some exemplary embodiments of the inventive concept, the third surface 210*a* of the second substrate 210 may be a surface facing the second surface 110*b* of the first substrate 110. In other words, the third surface 210*a* of the second substrate 210 may be closer to the second surface 110*b* of the first substrate 110 than the fourth surface 210*b* of the second substrate 210.

A plurality of electronic devices may be formed on the second substrate 210. For example, second electronic devices TR2 may be formed on the third surface 210*a* of the second substrate 210. The second electronic devices TR2 may be electrically connected to the sensor array region SAR to transmit and receive electrical signals to and from each unit pixel of the sensor array region SAR. For example, the second electronic devices TR2 may include electronic devices that form the row decoder 20, the row driver 30, the column decoder 40, the timing generator 50, the CDS 60, the ADC 70 and/or the I/O buffer 80 of FIG. 1A.

The second wiring structure IS2 may be formed on the second substrate 210. For example, the second wiring structure IS2 may cover the third surface 210*a* of the second substrate 210. The second substrate 210 and the second wiring structure IS2 may constitute a second substrate structure 200.

The second wiring structure IS2 may be attached to the first wiring structure IS1. For example, as illustrated in FIG. 4, an upper surface of the second wiring structure IS2 may be attached to a bottom surface of the first wiring structure IS1.

The second wiring structure IS2 may be composed of one or a plurality of wirings. For example, the second wiring structure IS2 may include a second inter-wiring insulating layer 230 and a plurality of wirings 232, 234 and 236 formed in the second inter-wiring insulating layer 230. In FIG. 4, the number of layers and arrangement of wirings constituting the second wiring structure IS2 are merely an example, and the present inventive concept is not limited thereto. The second inter-wiring insulating layer 230 may include, but is not limited to, at least one of silicon oxide, silicon nitride, silicon oxynitride, and a low-k material having a lower dielectric constant than silicon oxide. In some exemplary embodiments of the inventive concept, the second wiring structure IS2 may include the same material as the first wiring structure IS1.

At least some of the wirings 232, 234 and 236 of the second wiring structure IS2 may be connected to the second electronic devices TR2. In some exemplary embodiments of the inventive concept, the second wiring structure IS2 may include third wirings 232 in the sensor array region SAR, a fourth wiring 234 in the connection region CR, and a fifth wiring 236 in the pad region PR. In some exemplary embodiments of the inventive concept, the fourth wiring 234 may be an uppermost wiring among a plurality of wirings in the connection region CR, and the fifth wiring 236 may be an uppermost wiring among a plurality of wirings in the pad region PR.

The third wirings 232, the fourth wiring 234 and the fifth wiring 236 may include, but are not limited to, at least one of tungsten (W), copper (Cu), aluminum (Al), gold (Au), silver (Ag), and alloys of the same.

The surface insulating layer 140 may be formed on the first surface 110a of the first substrate 110. The surface insulating layer 140 may extend along the first surface 110a of the first substrate 110. In some exemplary embodiments of the inventive concept, at least a part of the surface insulating layer 140 may contact the pixel separation pattern 120.

The surface insulating layer 140 may include an insulating material. For example, the surface insulating layer 140 may include, but is not limited to, at least one of silicon oxide, silicon nitride, silicon oxynitride, aluminum oxide, hafnium oxide, and combinations of the same.

In some exemplary embodiments of the inventive concept, the surface insulating layer 140 may be formed as a multilayer. For example, as illustrated in FIGS. 5 and 7A, the surface insulating layer 140 may include first, second, third, fourth and fifth insulating layers 141, 142, 143, 144 and 145 sequentially stacked on the first surface 110a of the first substrate 110. For example, the first insulating layer 141 may include an aluminum oxide layer, the second insulating layer 142 may include a hafnium oxide layer, the third insulating layer 143 may include a silicon oxide layer, the fourth insulating layer 144 may include a silicon nitride layer, and the fifth insulating layer 145 may include a hafnium oxide layer, but the present inventive concept is not limited thereto.

The surface insulating layer 140 may function as an anti-reflection layer to prevent reflection of light incident on the first substrate 110, thereby increasing the light reception rate of the photoelectric conversion layer PD. In addition, the surface insulating layer 140 may function as a planarization layer so that the color filters 170 and the microlenses 180 to be described later can be formed to a uniform height.

The conductor contacts 150 may be formed in the surface insulating layer 140. For example, as illustrated in FIGS. 6 and 7A, second trenches 150t may be formed in the surface insulating layer 140. The conductor contacts 150 may fill the second trenches 150t. In some exemplary embodiments of the inventive concept, the second trenches 150t may expose an upper surface of the pixel separation pattern 120.

Although a width W23 of each conductor contact 150 is the same as a width W21 of the pixel separation pattern 120 in the drawings, this is merely an example. For example, the width W23 of each conductor contact 150 may be smaller or greater than the width W21 of the pixel separation pattern 120.

The conductor contacts 150 may be formed only on a part of the pixel separation pattern 120. For example, as illustrated in FIGS. 4 through 7A, the pixel separation pattern 120 may include a first portion 120A and a second portion 120B arranged in a horizontal direction (e.g., a direction parallel to the first surface 110a or the second surface 110b). The conductor contacts 150 may be formed only on the first portion 120A of the pixel separation pattern 120 and may not be formed on the second portion 120B of the pixel separation pattern 120.

In some exemplary embodiments of the inventive concept, the first portion 120A of the pixel separation pattern 120 may correspond to grid points of the pixel separation pattern 120 formed in a grid shape. In other words, the conductor contacts 150 may overlap the grid points of the pixel separation pattern 120 formed in a grid shape. Herein, "overlap" may refer to overlapping in a vertical direction (e.g., a direction intersecting the first surface 110a or the second surface 110b).

For example, as illustrated in FIG. 3, the light receiving region APS may include intersection regions III in which the first regions I and the second regions II intersect. The conductor contacts 150 may be formed in the surface insulating layer 140 of the intersection regions III. For example, a conductor contact 150 may overlap the pixel separation pattern 120 interposed between the second pixel PX2 and the fourth pixel PX4.

In some exemplary embodiments of the inventive concept, each conductive contact 150 may be shaped like a circular cylinder or an elliptical cylinder. For example, each conductor contact 150 may be circular or elliptical in a plan view.

The conductor contacts 150 may include a conductive material. Accordingly, the conductor contacts 150 may prevent charges generated by ESD or the like from accumulating on the first surface 110a of the first surface 110, thereby effectively preventing the ESD bruising defect.

In some exemplary embodiments of the inventive concept, each of the conductor contacts 150 may be formed as a multilayer. For example, as illustrated in FIG. 7A, each of the conductor contacts 150 may include first, second and third conductive layers 152, 154 and 156 sequentially stacked on the pixel separation pattern 120.

In some exemplary embodiments of the inventive concept, the first conductive layer 152 and the second conductive layer 154 may be barrier conductive layers, and the third conductive layer 156 may be a metal conductive layer. For example, the first conductive layer 152 and the second conductive layer 154 may include at least one of titanium (Ti), titanium nitride (TiN), tantalum (Ta), tantalum nitride (TaN), and combinations of the same. For example, the third conductive layer 156 may include at least one of tungsten (W), aluminum (Al), copper (Cu), and combinations of the same. For example, the first conductive layer 152 may include a titanium (Ti) layer, the second conductive layer 154 may include a titanium nitride (TiN) layer, and the third conductive layer 156 may include a tungsten (W) layer, but the present inventive concept is not limited thereto.

In some exemplary embodiments of the inventive concept, the conductor contacts 150 may contact the pixel separation pattern 120. For example, the first conductive layer 152 of each conductor contact 150 may contact an upper part of the pixel separation pattern 120. For example, the first conductive layer 152 may directly contact a surface of the insulating spacer layer 122 and the filling conductive layer 124.

In some exemplary embodiments of the inventive concept, the conductor contacts 150 may be electrically connected to the pixel separation pattern 120. For example, each of the conductor contacts 150 may contact the filling conductive layer 124 of the pixel separation pattern 120 including a conductive material. Accordingly, charges generated by ESD or the like can be discharged to the pixel separation pattern 120 through the conductor contacts 150, and the ESD bruising defect can be effectively prevented.

The color filters 170 may be formed on the surface insulating layer 140 of the light receiving region APS. In some exemplary embodiments of the inventive concept, the color filters 170 may be arranged to correspond to the unit pixels, respectively. For example, the color filters 170 may be arranged in two dimensions (e.g., in a matrix) in a plane including the first direction X and the second direction Y.

The color filters 170 may have various color filters according to the unit pixels. For example, the color filters 170 may be arranged in a Bayer pattern including a red color filter, a green color filter, and a blue color filter. However, this is merely an example, and the color filters 170 may also include a yellow filter, a magenta filter and a cyan filter and may further include a white filter.

The grid pattern 160 may be formed on the surface insulating layer 140. In other words, the conductor contacts 150 may be interposed between the pixel separation pattern 120 and the grid pattern 160. The grid pattern 160 may be formed in a grid shape in a plan view and interposed between the color filters 170. For example, as illustrated in FIGS. 5 and 7A, the color filters 170 may include a first color filter 170A and a second color filter 170B adjacent to each other. Here, the grid pattern 160 may be interposed between the first color filter 170A and the second color filter 170B. In addition, a portion of the first color filter 170A and a portion of the second color filter 170B may cover the grid pattern 160.

Although a width W12 or W22 of the grid pattern 160 is the same as the width W11 or W21 of the pixel separation pattern 120 in the drawings, this is merely an example. For example, the width W12 or W22 of the grid pattern 160 may be smaller or greater than the width W11 or W21 of the pixel separation pattern 120.

In addition, although the width W22 of the grid pattern 160 is the same as the width W23 of each conductor contact 150 in the drawings, this is merely an example. For example, the width W22 of the grid pattern 160 may be smaller or greater than the width W23 of each conductor contact 150.

In some exemplary embodiments of the inventive concept, since the color filters 170 may be arranged to correspond to the unit pixels, respectively, the grid pattern 160 may overlap the pixel separation pattern 120. For example, referring to FIG. 3, a part of the grid pattern 160 may be formed in the first regions I, and the other part of the grid pattern 160 may be formed in the second regions II. Accordingly, the conductor contacts 150 may be interposed between the first portion 120A of the pixel separation pattern 120 and the grid pattern 160 and may not be interposed between the second portion 120B of the pixel separation pattern 120 and the grid pattern 160.

In some exemplary embodiments of the inventive concept, since the first portion 120A of the pixel separation pattern 120 may correspond to the grid points of the pixel separation pattern 120 formed in a grid shape, the conductor contacts 150 may overlap grid points of the grid pattern 160 formed in a grid shape.

In some exemplary embodiments of the inventive concept, the grid pattern 160 may contact the surface insulating layer 140 and the conductor contacts 150. For example, as illustrated in FIGS. 3 through 5, the grid pattern 160 may contact the surface insulating layer 140 in the first regions I and the second regions II excluding the intersection regions III. In addition, as illustrated in FIGS. 3, 6 and 7A, the grid pattern 160 may contact the conductor contacts 150 in the intersection regions III.

The grid pattern 160 may include a low refractive index material having a refractive index lower than that of silicon (Si). For example, the grid pattern 160 may include, but is not limited to, at least one of silicon oxide, aluminum oxide, tantalum oxide, and combinations of the same. The grid pattern 160 including a low refractive index material may refract or reflect light obliquely incident on the image sensor, thereby increasing the quality of the image sensor.

In some exemplary embodiments of the inventive concept, a first protective layer 165 may be formed on the surface insulating layer 140 and the grid pattern 160. The first protective layer 165 may be interposed between the surface insulating layer 140 and the color filters 170 and between the grid pattern 160 and the color filters 170. For example, the first protective layer 165 may extend along profiles of an upper surface of the surface insulating layer 140 and side and upper surfaces of the grid pattern 160.

The first protective layer 165 may include, but is not limited to, aluminum oxide. The first protective layer 165 may prevent damage to the surface insulating layer 140 and the grid pattern 160.

The microlenses 180 may be formed on the color filters 170. The microlenses 180 may be arranged to correspond to the unit pixels, respectively. For example, the microlenses 180 may be arranged in two dimensions (e.g., in a matrix) in a plane including the first direction X and the second direction Y.

Each of the microlenses 180 may be convex and may have a predetermined radius of curvature. Accordingly, each of the microlenses 180 may concentrate incident light on the photoelectric conversion layer PD. Each of the microlenses 180 may include, but is not limited to, a light transmitting resin.

In some exemplary embodiments of the inventive concept, a second protective layer 185 may be formed on the microlenses 180. The second protective layer 185 may extend along surfaces of the microlenses 180. The second protective layer 185 may include, for example, an inorganic oxide layer. For example, the second protective layer 185 may include, but is not limited to, at least one of silicon oxide, titanium oxide, zirconium oxide, hafnium oxide, and combinations of the same. In some exemplary embodiments of the inventive concept, the second protective layer 185 may include low-temperature oxide (LTO).

The second protective layer 185 may protect the microlenses 180 from the outside. For example, the second protective layer 185 may include an inorganic oxide layer to protect the microlenses 180 including an organic material. In addition, the second protective layer 185 may increase the light concentrating capability of the microlenses 180. For example, the second protective layer 185 may fill a space between the microlenses 180 to reduce reflection, refraction, and scattering of incident light reaching the space between the microlenses 180.

Figure 7B:
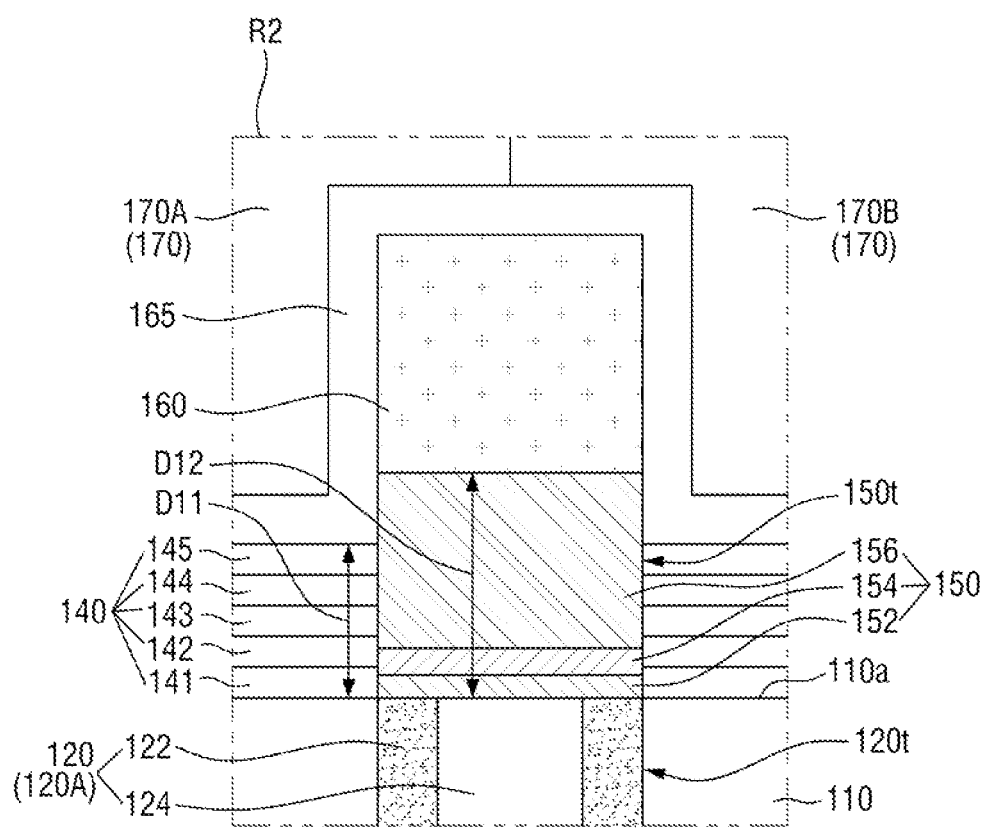

Referring to FIGS. 6 and 7B, in an image sensor according to exemplary embodiments of the inventive concept, a conductor contact 150 may protrude from an upper surface of a surface insulating layer 140.

For example, a height D12 of an upper surface of the conductor contact 150 from a first surface 110a of a first substrate 110 may be greater than a height D11 of the upper surface of the surface insulating layer 140. In this case, the size of the grid pattern 160 may be reduced.

Figure 7C:
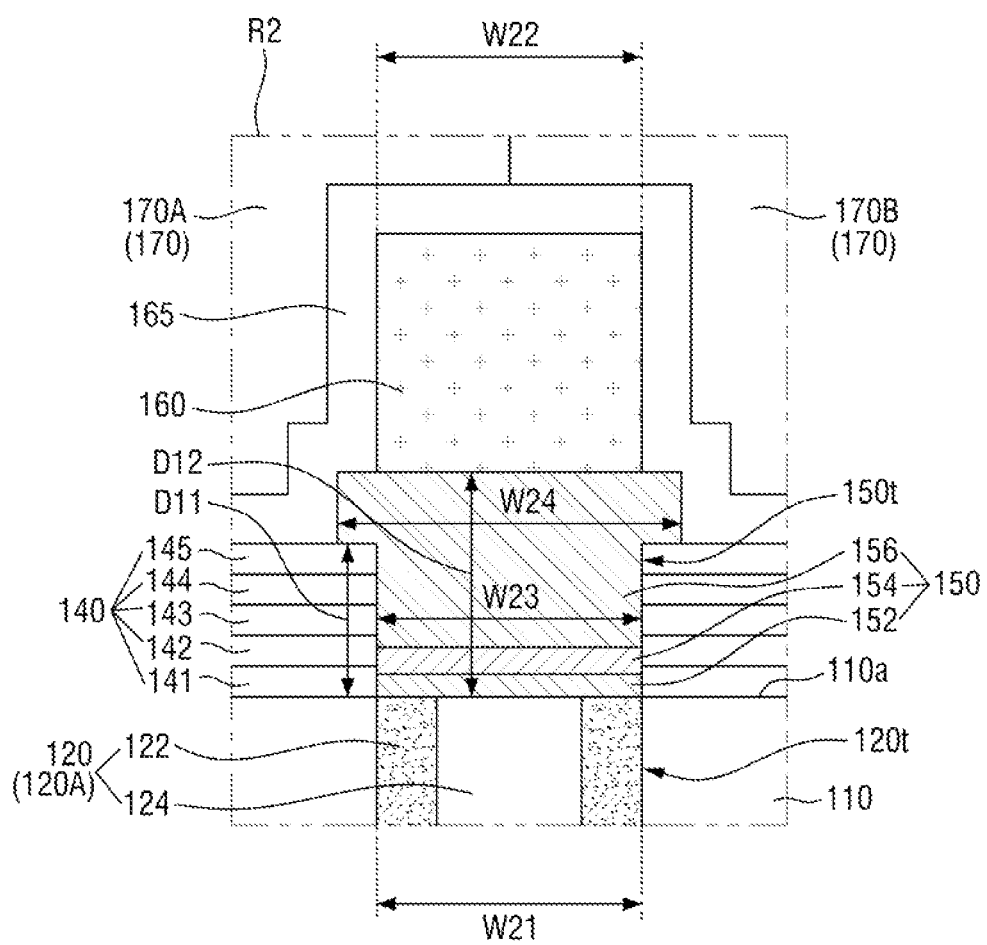

Referring to FIGS. 6 and 7C, in an image sensor according to exemplary embodiments of the inventive concept, a part of a conductor contact 150 may extend along a part of an upper surface of a surface insulating layer 140.

For example, a width W24 of an upper part of the conductor contact 150 protruding from the upper surface of the surface insulating layer 140 may be greater than a width W23 of a second trench 150t. Accordingly, the upper part of the conductor contact 150 protruding from the upper surface of the surface insulating layer 140 may extend along a part of the upper surface of the surface insulating layer 140 adjacent to the conductor contact 150.

Figure 7D:
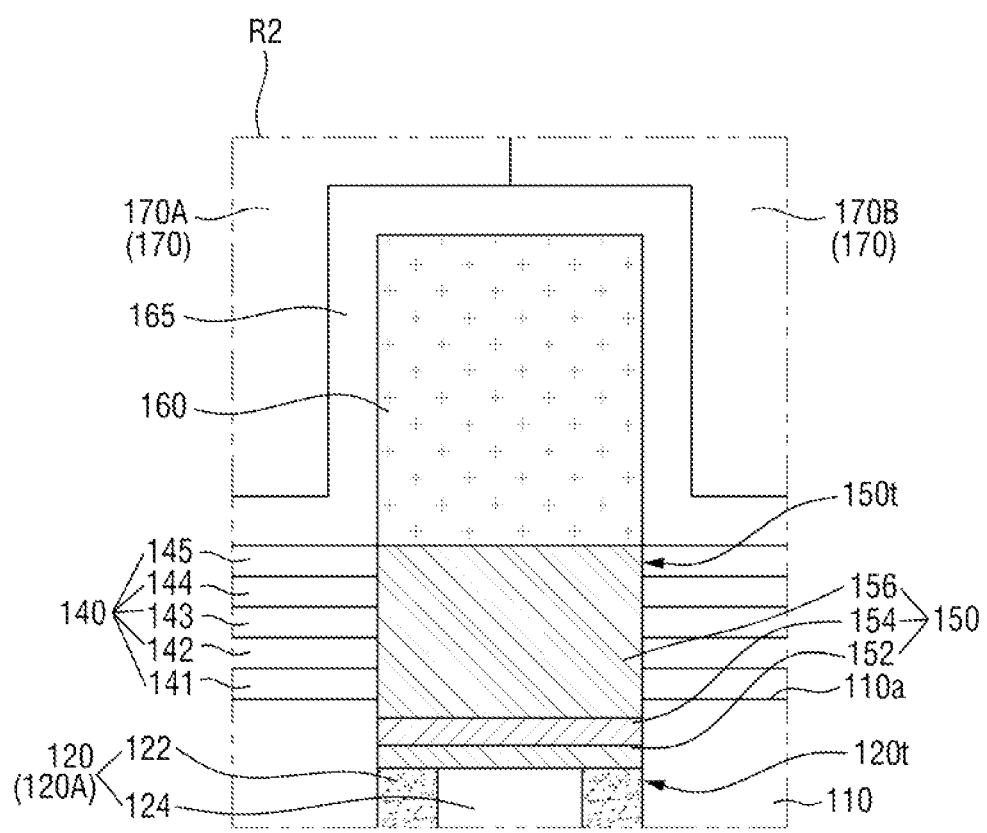

Referring to FIGS. 6 and 7D, in an image sensor according to exemplary embodiments of the inventive concept, a conductor contact 150 may protrude from a lower surface of a surface insulting layer 140.

For example, a lower surface of a second trench 150t may be formed lower than the lower surface of the surface insulating layer 140. In some exemplary embodiments of the inventive concept, the conductor contact 150 may be formed in the second trench 150t to contact a pixel separation pattern 120. In this case, the size of the pixel separation pattern 120 may be reduced.

Figure 7E:
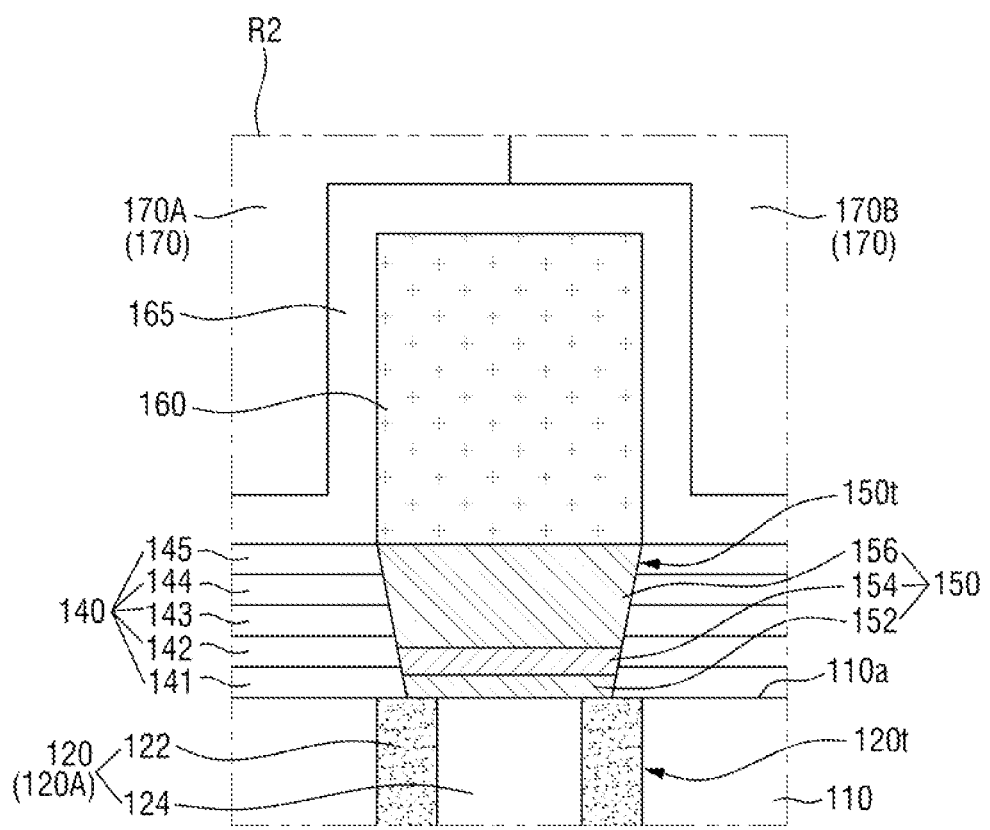

Referring to FIGS. 6 and 7E, in an image sensor according to exemplary embodiments of the inventive concept, a width of a conductor contact 150 may decrease as the distance to a pixel separation pattern 120 decreases.

For example, a width of a second trench 150t may decrease as the distance to the pixel separation pattern 120 decreases. In some exemplary embodiments of the inventive concept, a width of a first conductive layer 152 may be smaller than a width of a second conductive layer 154, and the width of the second conductive layer 154 may be smaller than a width of a third conductive layer 156. In other words, the conductor contact 150 may be tapered.

Figure 7F:
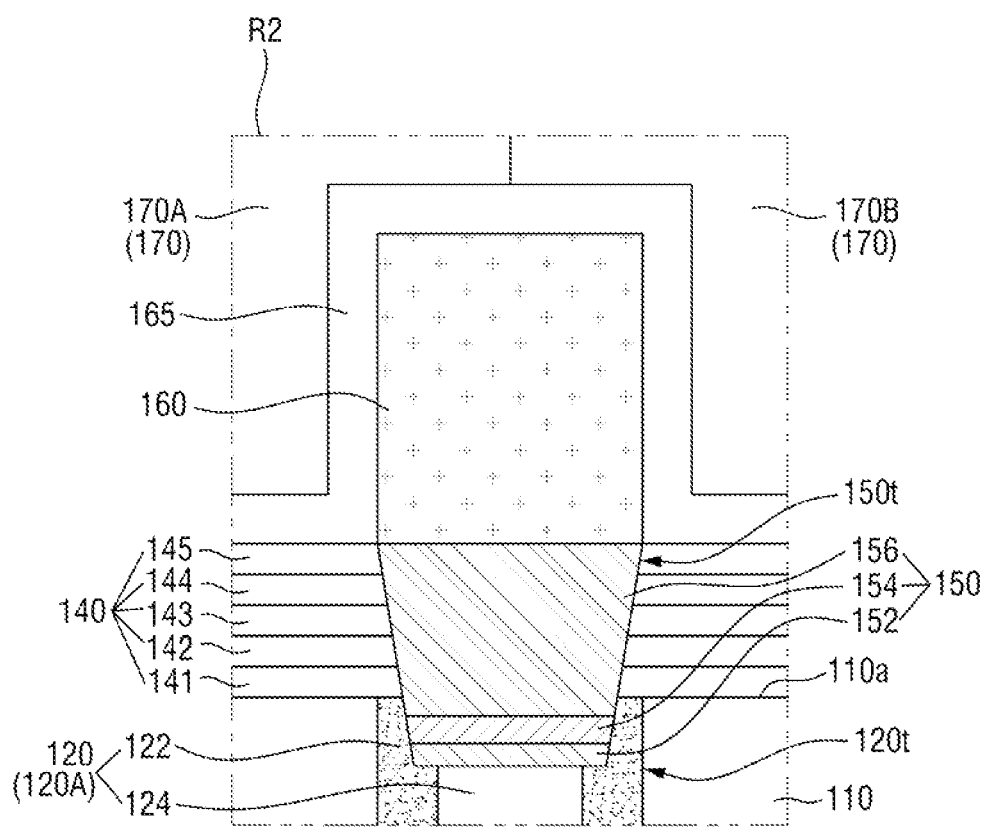

Referring to FIGS. 6 and 7F, in an image sensor according to exemplary embodiments of the inventive concept, a conductor contact 150 may protrude from a lower surface of a surface insulating layer 140.

For example, a lower part of a second trench 150t may be formed in an upper part of a pixel separation pattern 120. In some exemplary embodiments of the inventive concept, a width of a lowest part of the conductor contact 150 may be smaller than a width of a highest part of the pixel separation pattern 120.

Figure 7G:
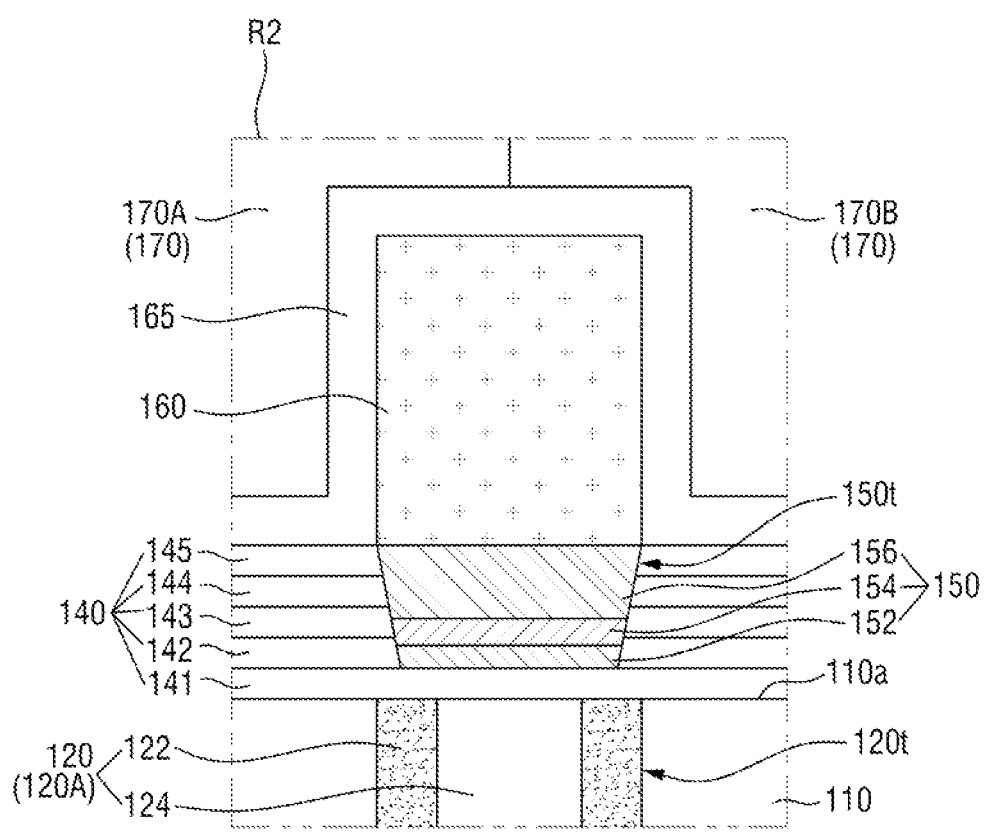

Referring to FIGS. 6 and 7G, in an image sensor according to exemplary embodiments of the inventive concept, a conductor contact 150 may be spaced apart from a pixel separation pattern 120.

For example, a lowest surface of a second trench 150t may be formed higher than a highest surface of the pixel separation pattern 120. In this case, the conductor contact 150 may not be electrically connected to the pixel separation pattern 120. For example, a first insulating layer 141 may be disposed between the conductor contact 150 and the pixel separation pattern 120.

Figure 7H:
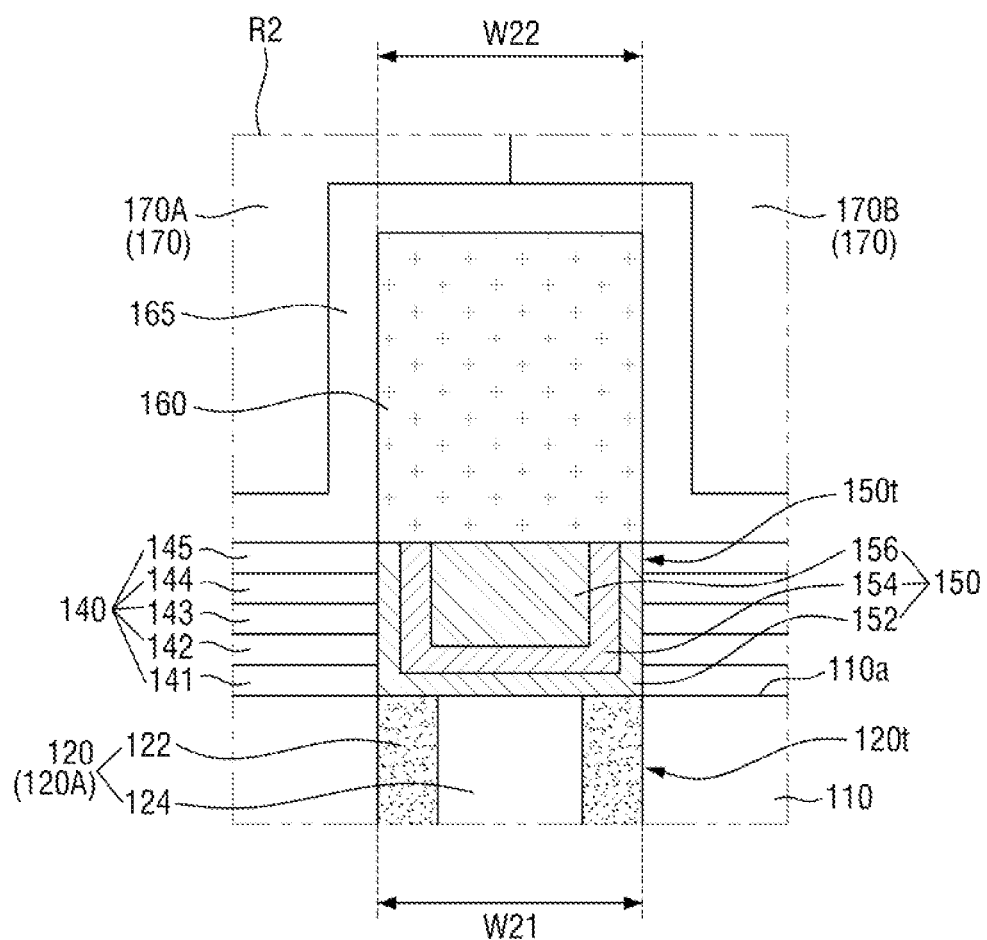

Referring to FIGS. 6 and 7H, in an image sensor according to exemplary embodiments of the inventive concept, a first conductive layer 152 and a second conductive layer 154 of a conductor contact 150 may extend alongside surfaces of a surface insulating layer 140.

For example, the first conductive layer 152 of the conductor contact 150 may extend along profiles of side and lower surfaces of a second trench 150t. The second conductive layer 154 of the conductor contact 150 may be formed on the first conductive layer 152 and extend along a profile of the first conductive layer 152. A third conductive layer 156 of the conductor contact 150 may fill a region of the second trench 150t remaining after the first conductive layer 152 and the second conductive layer 154 are formed.

Referring again to FIG. 4, the image sensor according to the exemplary embodiments of the inventive concept may further include a first connection structure 350, a second connection structure 450, and a third connection structure 550.

The first connection structure 350 may be formed in the light blocking region OB. The first connection structure 350 may be formed on the surface insulating layer 140 of the light blocking region OB. The first connection structure 350 may contact the pixel separation pattern 120. For example, a third trench 355t exposing the pixel separation pattern 120 may be formed in the first substrate 110 and the surface insulating layer 140 of the light blocking region OB. The first connection structure 350 may be formed in the third trench 355t to contact the pixel separation pattern 120 in the light blocking region OB. In some exemplary embodiments of the inventive concept, the first connection structure 350 may extend along profiles of side and lower surfaces of the third trench 355t.

In some exemplary embodiments of the inventive concept, the first connection structure 350 may be electrically connected to the pixel separation pattern 120 to apply a ground voltage or a negative voltage to the pixel separation pattern 120. Accordingly, charges generated by ESD or the like can be discharged to the first connection structure 350 through the pixel separation pattern 120, and the ESD bruising defect can be effectively prevented.

In some exemplary embodiments of the inventive concept, the first connection structure 350 may be formed at the same level as the conductor contacts 150. As used herein, the term "same level" may mean that different elements are formed by the same fabrication process. For example, the first connection structure 350 may include a titanium (Ti) layer, a titanium nitride (TiN) layer, and a tungsten (W) layer sequentially stacked in the third trench 355t.

In some exemplary embodiments of the inventive concept, a first pad 355 filling the third trench 355t may be formed on the first connection structure 350. The first pad 355 may include, but is not limited to, at least one of tungsten (W), copper (Cu), aluminum (Al), gold (Au), silver (Ag), and alloys of the same.

In some exemplary embodiments of the inventive concept, the first protective layer 165 may cover the first connection structure 350 and the first pad 355. For example, the first protective layer 165 may extend along profiles of the first connection structure 350 and the first pad 355.

The second connection structure 450 may be formed in the connection region CR. The second connection structure 450 may be formed on the surface insulating layer 140 of the connection region CR. The second connection structure 450 may electrically connect the first substrate structure 100 and the second substrate structure 200. For example, a fourth trench 455t exposing the second wiring 134 and the fourth wiring 234 may be formed in the first substrate structure 100 and the second substrate structure 200 of the connection region CR. The second connection structure 450 may be formed in the fourth trench 455t to connect the second wiring 134 and the fourth wiring 234. In some exemplary embodiments of the inventive concept, the second connection structure 450 may extend along profiles of side and lower surfaces of the fourth trench 455t.

In some exemplary embodiments of the inventive concept, the second connection structure 450 may be formed at the same level as the conductor contacts 150. For example, the second connection structure 450 may include a titanium (Ti) layer, a titanium nitride (TiN) layer, and a tungsten (W) layer sequentially stacked in the fourth trench 455t.

In some exemplary embodiments of the inventive concept, the first protective layer 165 may cover the second connection structure 450. For example, the first protective layer 165 may extend along a profile of the second connection structure 450.

In some exemplary embodiments of the inventive concept, a first filling insulating layer 460 filling the fourth trench 455t may be formed on the second connection structure 450. The first filling insulating layer 460 may include, but is not limited to, at least one of silicon oxide, aluminum oxide, tantalum oxide, and combinations of the same.

The third connection structure 550 may be formed in the pad region PR. The third connection structure 550 may be formed on the surface insulating layer 140 of the pad region PR. The third connection structure 550 may electrically connect the second substrate structure 200 and an external device.

For example, a fifth trench 550t exposing the fifth wiring 236 may be formed in the first substrate structure 100 and the second substrate structure 200 of the pad region PR. The third connection structure 550 may be formed in the fifth trench 550t to contact the fifth wiring 236. In addition, a sixth trench 555t may be formed in the first substrate 110 of the pad region PR. The third connection structure 550 may be formed and exposed in the sixth trench 555t. In some exemplary embodiments of the inventive concept, the third connection structure 550 may extend along profiles of side and lower surfaces of the fifth trench 550t and the sixth trench 555t.

In some exemplary embodiments of the inventive concept, a second filling insulating layer 560 filling the fifth trench 550t may be formed on the third connection structure 550. The second filling insulating layer 560 may include, but is not limited to, at least one of silicon oxide, aluminum oxide, tantalum oxide, and combinations of the same.

In some exemplary embodiments of the inventive concept, a second pad 555 filling the sixth trench 555t may be formed on the third connection structure 550. The second pad 555 may include, but is not limited to, at least one of tungsten (W), copper (Cu), aluminum (Al), gold (Au), silver (Ag), and alloys of the same.

In some exemplary embodiments of the inventive concept, the third connection structure 550 may be formed at the same level as the conductor contacts 150. For example, the third connection structure 550 may include a titanium (Ti) layer, a titanium nitride (TiN) layer, and a tungsten (W) layer sequentially stacked in the fifth trench 550t.

In some exemplary embodiments of the inventive concept, the first protective layer 165 may cover the third connection structure 550. For example, the first protective layer 165 may extend along a profile of the third connection structure 550. In some exemplary embodiments of the inventive concept, the first protective layer 165 may expose the second pad 555. For example, the second pad 555 may be exposed by the first protective layer 165, while the first pad 355 may be covered by the first protective layer 165.

In some exemplary embodiments of the inventive concept, a device isolation pattern 115 may be formed in the first substrate 110. For example, a seventh trench 115t may be formed in the first substrate 110. The device isolation pattern 115 may be formed in the seventh trench 115t.

Although the device isolation pattern 115 is formed only around the third connection structure 550 of the pad region PR in FIG. 4, this is merely an example. For example, the device isolation pattern 115 may also be formed around the first connection structure 350 of the light blocking region OB or around the second connection structure 450 of the connection region CR.

The device isolation pattern 115 may include, but is not limited to, at least one of silicon oxide, silicon nitride, silicon oxynitride, aluminum oxide, hafnium oxide, and combinations of the same. In some exemplary embodiments of the inventive concept, the device isolation pattern 115 may be formed at the same level as the surface insulating layer 140.

In some exemplary embodiments of the inventive concept, a third color filter 170C may be formed on the first connection structure 350 and the second connection structure 450. For example, the third color filter 170C may be formed to partially cover the first protective layer 165 in the light blocking region OB and the connection region CR. The third color filter 170C may include, but is not limited to, a blue color filter. The third color filter 170C may overlap the first pad 355 and the first filling insulating layer 460, for example.

In some exemplary embodiments of the inventive concept, a third protective layer 380 may be formed on the third color filter 170C. For example, the third protective layer 380 may be formed to partially cover the first protective layer 165 in the light blocking region OB, the connection region CR, and the pad region PR. In some exemplary embodiments of the inventive concept, the second protective layer 185 may extend along a surface of the third protective layer 380. The third protective layer 380 may include, but is not limited to, a light transmitting resin. In some exemplary embodiments of the inventive concept, the third protective layer 380 may include the same material as the microlenses 180.

In some exemplary embodiments of the inventive concept, the second protective layer 185 and the third protective layer 380 may expose the second pad 555. For example, an exposure opening ER exposing the second pad 555 may be formed in the second protective layer 185 and the third protective layer 380. Accordingly, the second pad 555 may be connected to an external device or the like and configured to transmit and receive electrical signals between the image sensor according to the exemplary embodiments of the inventive concept and the external device.

As image sensors become highly integrated, unit pixels are increasingly becoming smaller. Accordingly, the occurrence of defects due to dark current or charge accumulation at the interface is increasing. For example, the ESD bruising defect in which charges generated by ESD or the like accumulate on a surface (e.g., the first surface 110a) of a substrate to generate a bruise-like stain on a generated image may occur.

To reduce the ESD bruising defect, a conductor may be formed between a surface insulating layer (e.g., 140) and a grid pattern (e.g., 160). However, the conductor may degrade dispersion of a grid pattern (e.g., 160), thereby reducing the sensitivity of an image sensor.

However, the image sensor according to the exemplary embodiments of the inventive concept includes the conductor contacts 150 disposed to overlap only a part of the pixel separation pattern 120. Therefore, the sensitivity of the image sensor can be increased, and crosstalk between unit pixels can be reduced.

For example, as described above, the conductor contacts 150 may not be formed in the first regions I and the second regions II excluding the intersection regions III. Therefore, the dispersion of the grid pattern 160 formed in the first regions I and the second regions II excluding the intersection regions III can be improved. Accordingly, an image sensor with increased sensitivity and thus increased quality can be provided.

In addition, the conductor contacts 150 formed in the intersection regions III can reduce crosstalk between unit pixels in the intersection regions III (e.g., crosstalk between the first pixel PX1 and a fifth pixel PX5 or crosstalk between the second pixel PX2 and the fourth pixel PX4). Accordingly, an image sensor with increased quality can be provided.

In addition, since the conductor contacts 150 can be formed at the same level as the first through third connection structures 350, 450 and 550, the process can be simplified. Therefore, an image sensor with increased productivity can be provided.

According to an exemplary embodiment of the inventive concept, there is provided an image sensor including: a substrate 110 which includes a first surface 110a and a second surface 110b opposite each other; a plurality of pixels PX1-PX9, each pixel comprising a photoelectric conversion layer PD in the substrate; a pixel separation pattern 120 disposed in the substrate and separating the pixels; a surface insulating layer 140 disposed on the first surface of the substrate; conductor contacts 150 disposed in the surface insulating layer; and a grid pattern 160 disposed on the surface insulating layer, wherein the pixel separation pattern comprises a first portion 120A and a second portion 120B arranged in a direction parallel to the first surface of the substrate, and as shown in FIG. 6, the conductor contacts 150 are interposed between the first portion 120A of the pixel separation pattern 120 and the grid pattern 160 and, as shown in FIG. 5, are not interposed between the second portion 120B of the pixel separation pattern 120 and the grid pattern 160.

Figure 8:
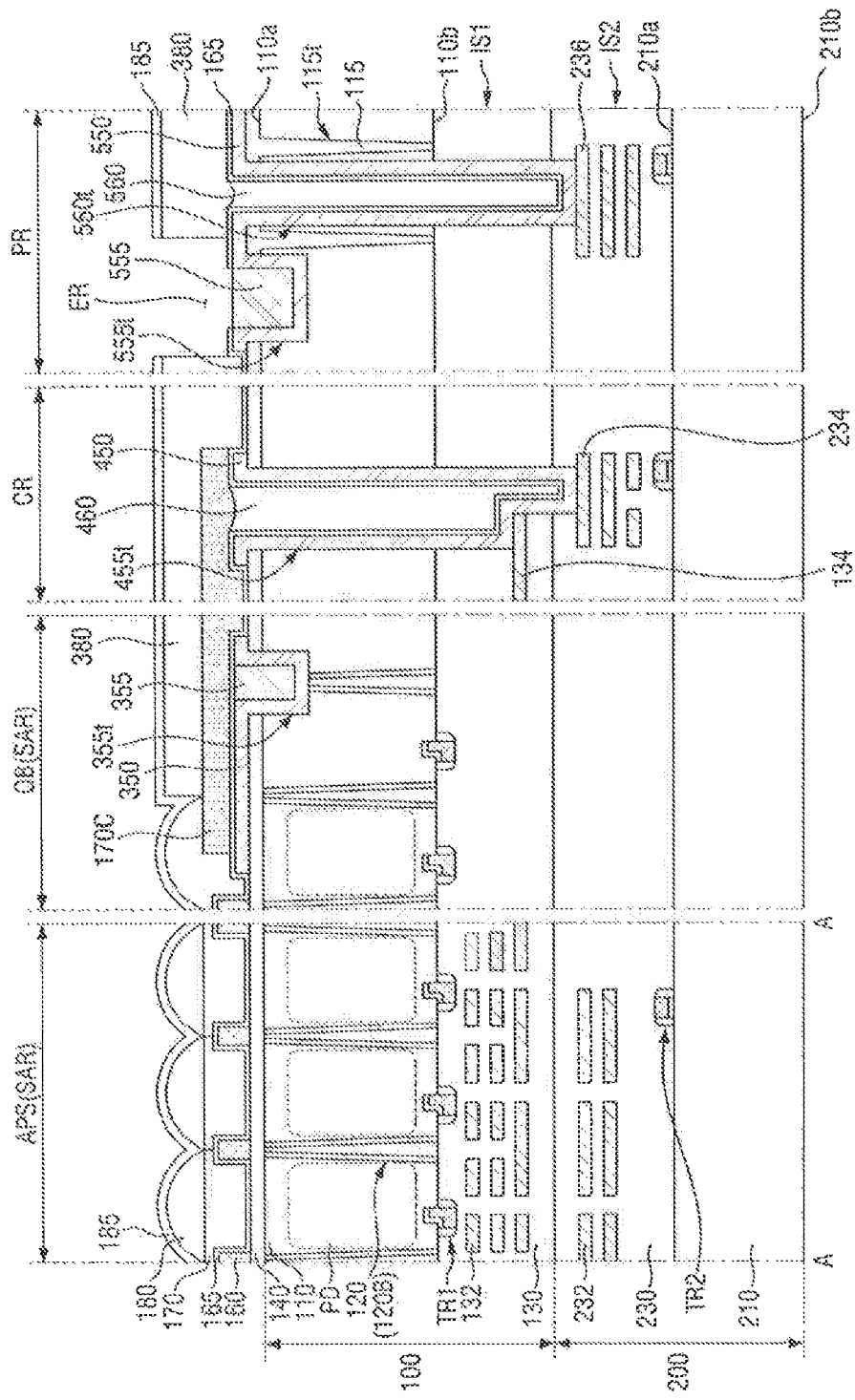
FIGS. 8 and 9 are cross-sectional views of an image sensor according to exemplary embodiments of the inventive concept.
Figure 9:
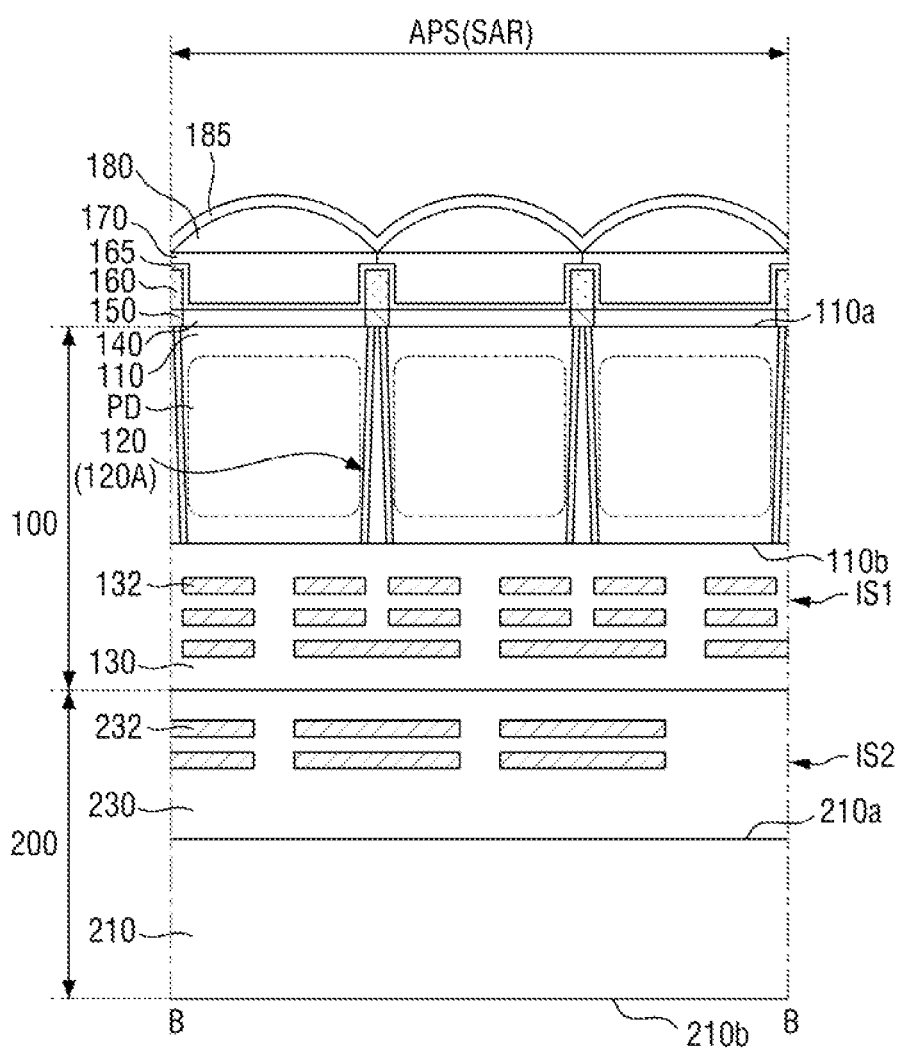

FIGS. 8 and 9 are cross-sectional views of an image sensor according to exemplary embodiments of the inventive concept. For ease of description, a description of elements and features described above using FIGS. 1 through 7H will be given briefly or omitted.

Referring to FIGS. 8 and 9, in the image sensor according to the exemplary embodiments of the inventive concept, a width of a pixel separation pattern 120 is reduced from a second surface 110b of a first substrate 110 toward a first surface 110a of the first substrate 110. In other words, the pixel separation pattern 120 may be tapered.

This may be due to characteristics of an etching process for forming the pixel separation pattern 120. For example, the process of etching the first substrate 110 to form the pixel separation pattern 120 may be performed on the second surface 110b of the first substrate 110.

In some exemplary embodiments of the inventive concept, a width of a device isolation pattern 115 may be reduced from the first surface 110a of the first substrate 110 toward the second surface 110b of the first substrate 110. In other words, the device isolation pattern 115 may be tapered.

This may be due to characteristics of an etching process for forming the device isolation pattern 115. For example, the process of etching the first substrate 110 to form the device isolation pattern 115 may be performed on the first surface 110a of the first substrate 110.

Figure 10:
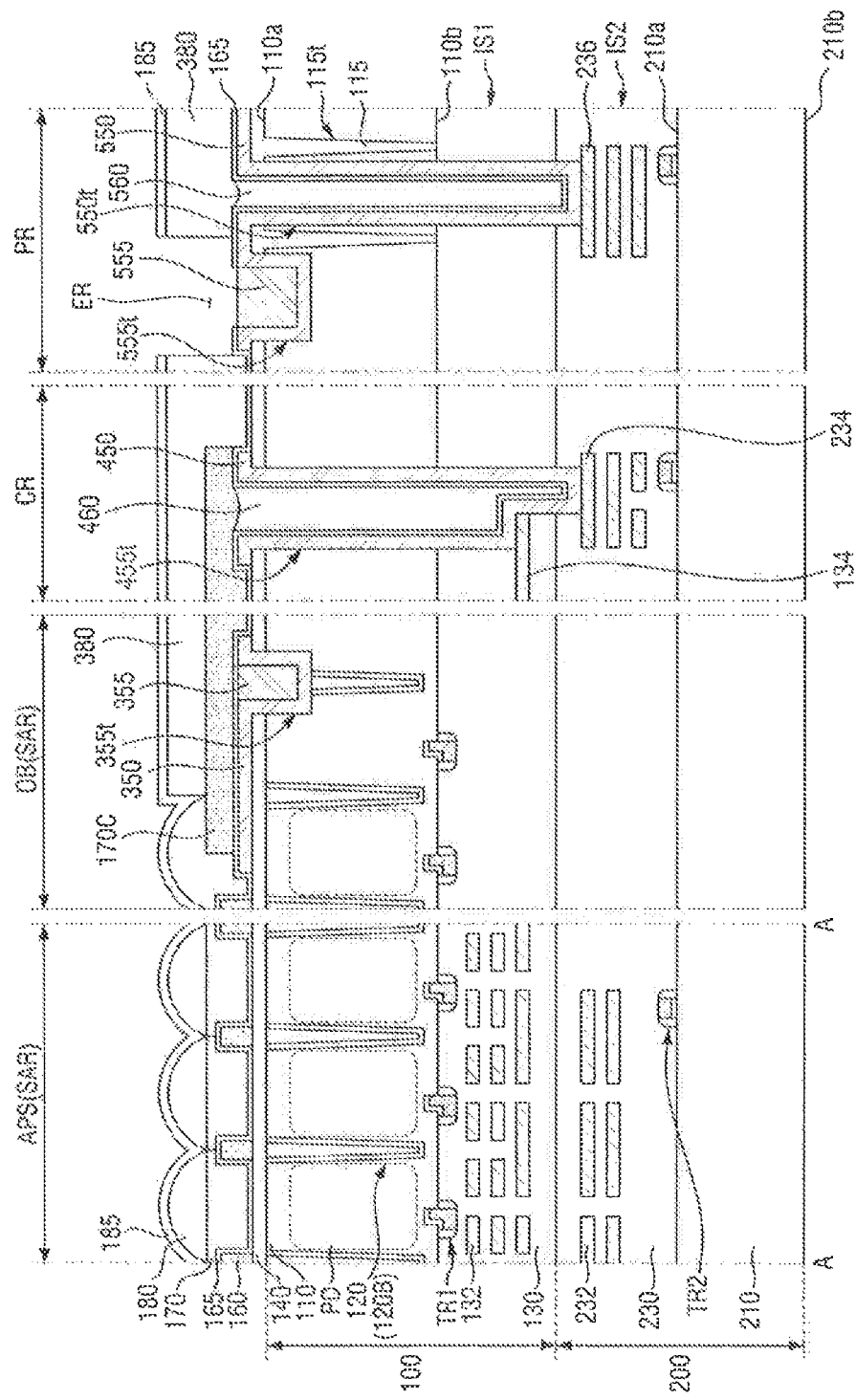
FIGS. 10 and 11 are cross-sectional views of an image sensor according to exemplary embodiments of the inventive concept.
Figure 11:
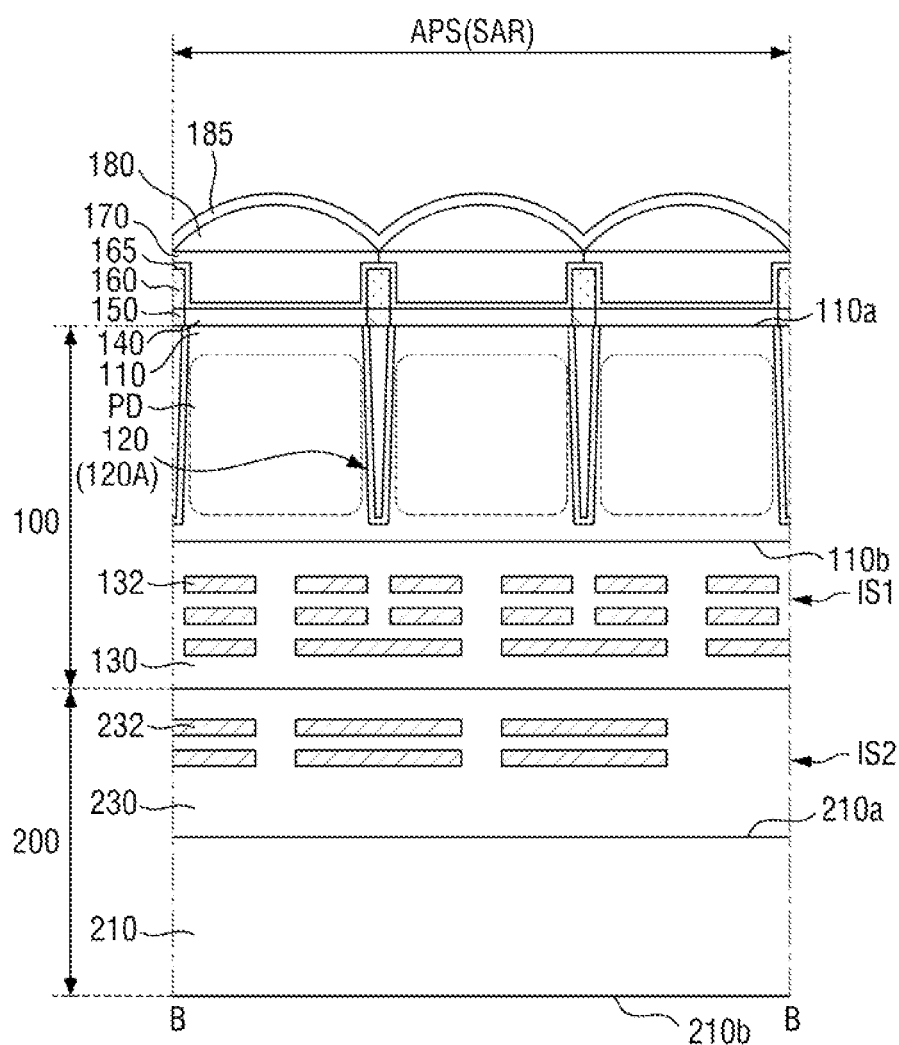

FIGS. 10 and 11 are cross-sectional views of an image sensor according to exemplary embodiments of the inventive concept. For ease of description, a description of elements and features described above using FIGS. 1 through 9 will be given briefly or omitted.

Referring to FIGS. 10 and 11, in the image sensor according to the exemplary embodiments of the inventive concept, a width of a pixel separation pattern 120 is reduced from a first surface 110a of a first substrate 110 toward a second surface 110b of the first substrate 110.

This may be due to characteristics of an etching process for forming the pixel separation pattern 120. For example, the process of etching the first substrate 110 to form the pixel separation pattern 120 may be performed on the first surface 110a of the first substrate 110.

In some exemplary embodiments of the inventive concept, the pixel separation pattern 120 may not completely penetrate the first substrate 110. For example, the pixel separation pattern 120 extends from the first surface 110a of the first substrate 110 but may not extend up to the second surface 110b of the first substrate 110. In other words, a lowest surface of the pixel separation pattern 120 may be spaced apart from the second surface 110b of the first substrate 110. For example, a portion of the first substrate 110 may be disposed between the lowest surface of the pixel separation pattern 120 and the second surface 110b of the first substrate 110.

Figure 12:
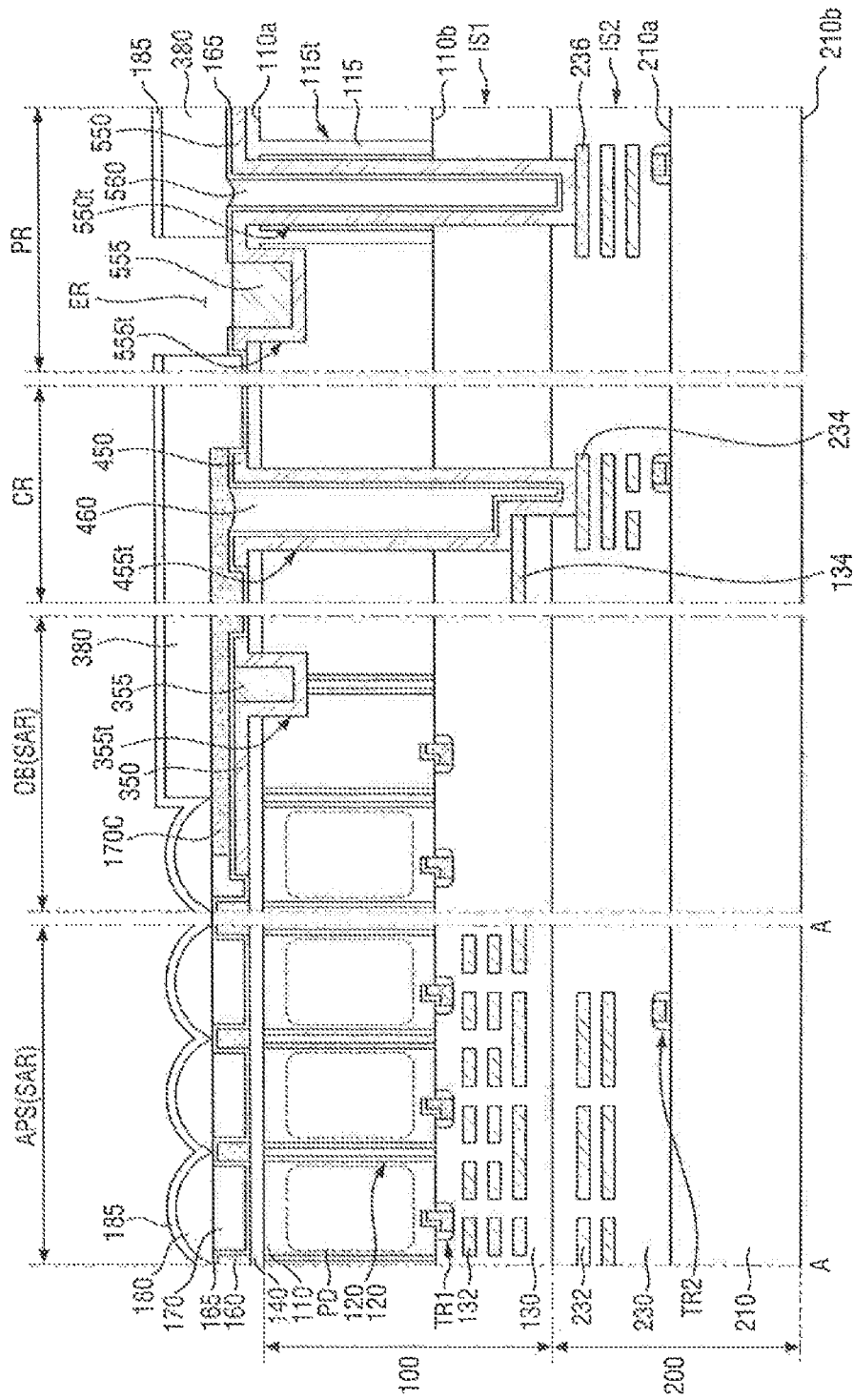
FIGS. 12 and 13 are cross-sectional views of an image sensor according to exemplary embodiments of the inventive concept.
Figure 13:
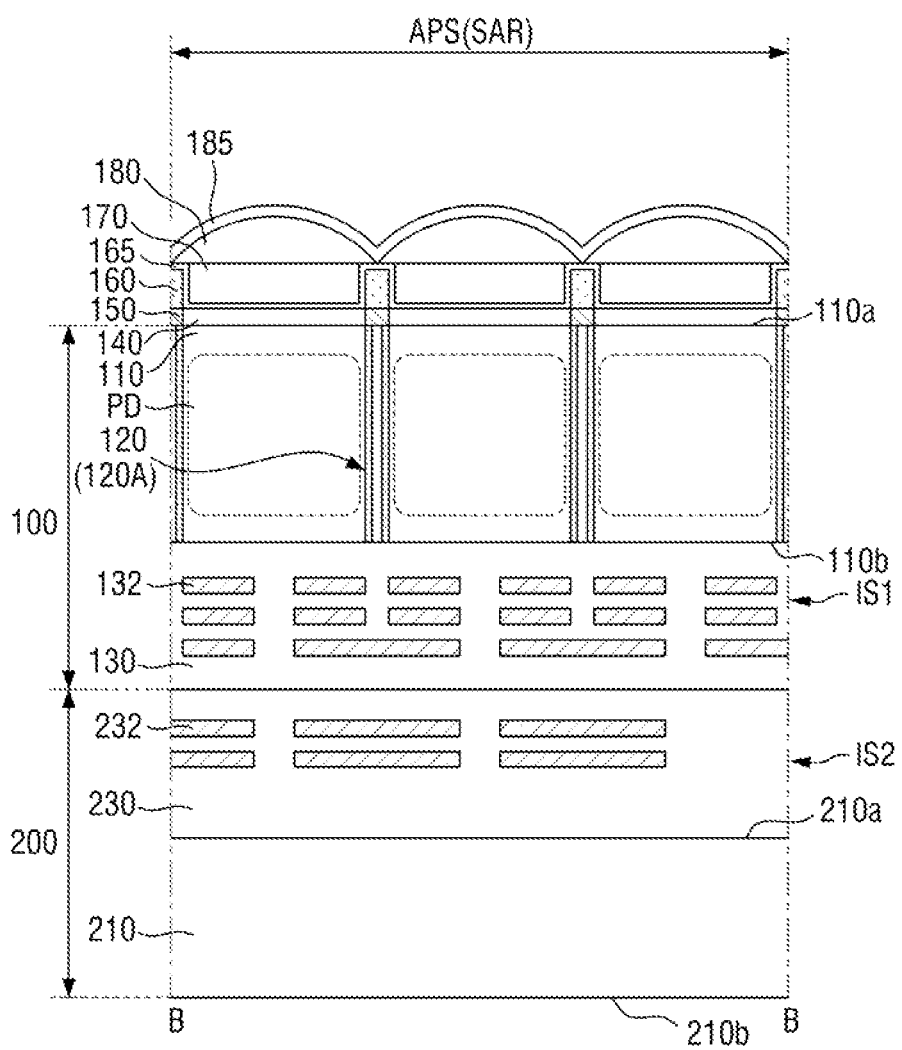

FIGS. 12 and 13 are cross-sectional views of an image sensor according to exemplary embodiments of the inventive concept. For ease of description, a description of elements and features described above using FIGS. 1 through 7H will be given briefly or omitted.

Referring to FIGS. 12 and 13, in the image sensor according to the exemplary embodiments of the inventive concept, a grid pattern 160 completely separates a plurality of color filters 170.

For example, the grid pattern 160 and a first protective layer 165 extending along a profile of the grid pattern 160 may be interposed between the color filters 170 to completely separate the color filters 170 from each other.

Although upper surfaces of the color filters 170 are the same as a highest surface of the first protective layer 165 in the drawings, this is merely an example. For example, the upper surfaces of the color filters 170 may be formed lower than the highest surface of the first protective layer 165.

Figure 14:
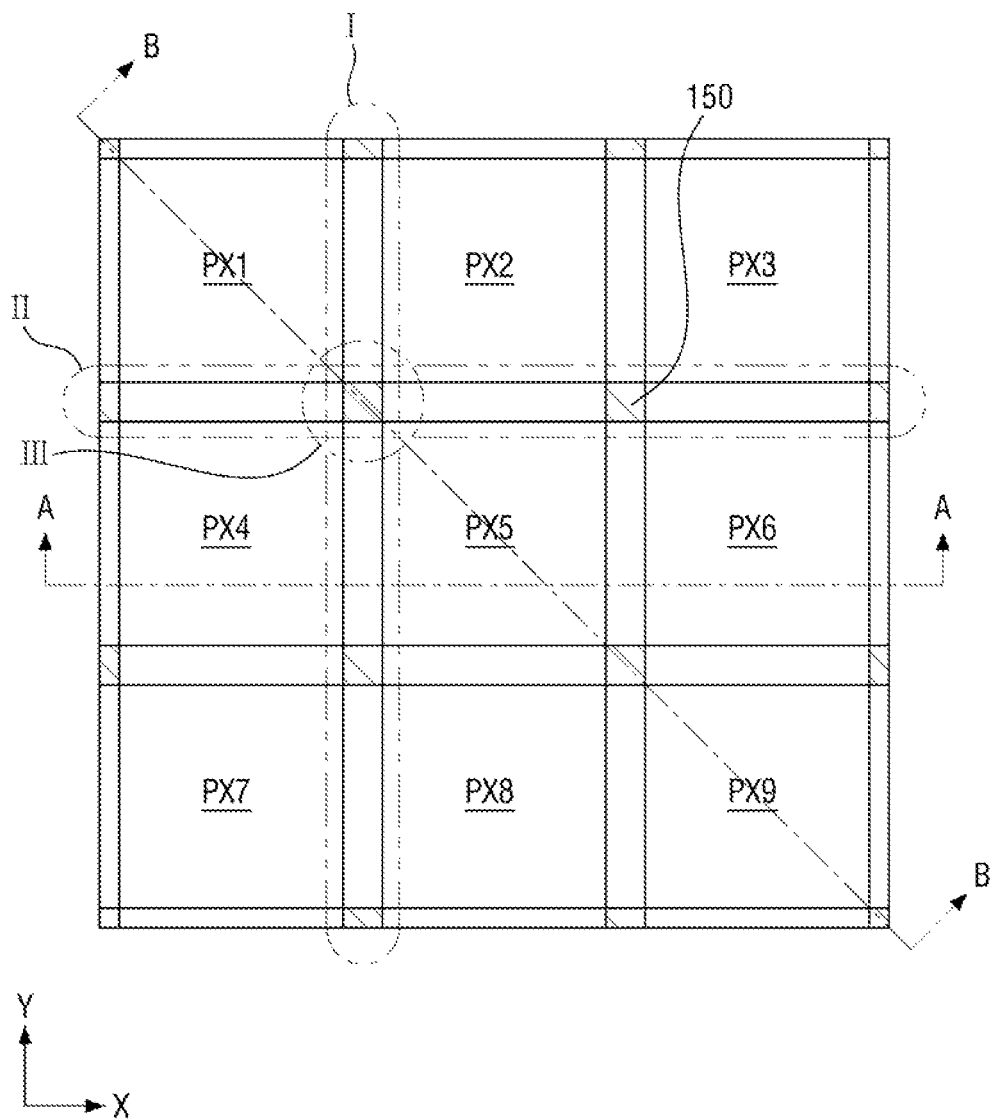
FIG. 14 is a layout view of an image sensor according to exemplary embodiments of the inventive concept.

FIG. 14 is an example layout view of an image sensor according to exemplary embodiments of the inventive concept. For ease of description, a description of elements and features described above using FIGS. 1 through 7H will be given briefly or omitted.

Referring to FIG. 14, in the image sensor according to the exemplary embodiments of the inventive concept, each conductor contact 150 is shaped like a polygonal prism.

For example, the conductor contacts 150 may be polygonal in a plan view. Although the conductor contacts 150 are quadrangular in a plan view in the drawing, this is merely an example. For example, each of the conductor contacts 150 may be shaped like another polygon such as a triangle in plan view.

A method of fabricating an image sensor according to exemplary embodiments of the inventive concept will now be described with reference to FIGS. 3 through 7H and 15 through 28.

FIGS. 15 through 28 are views illustrating steps of a method of fabricating an image sensor according to exemplary embodiments of the inventive concept. For ease of description, a description of elements and features described above using FIGS. 1 through 14 will be given briefly or omitted.

Figure 15:
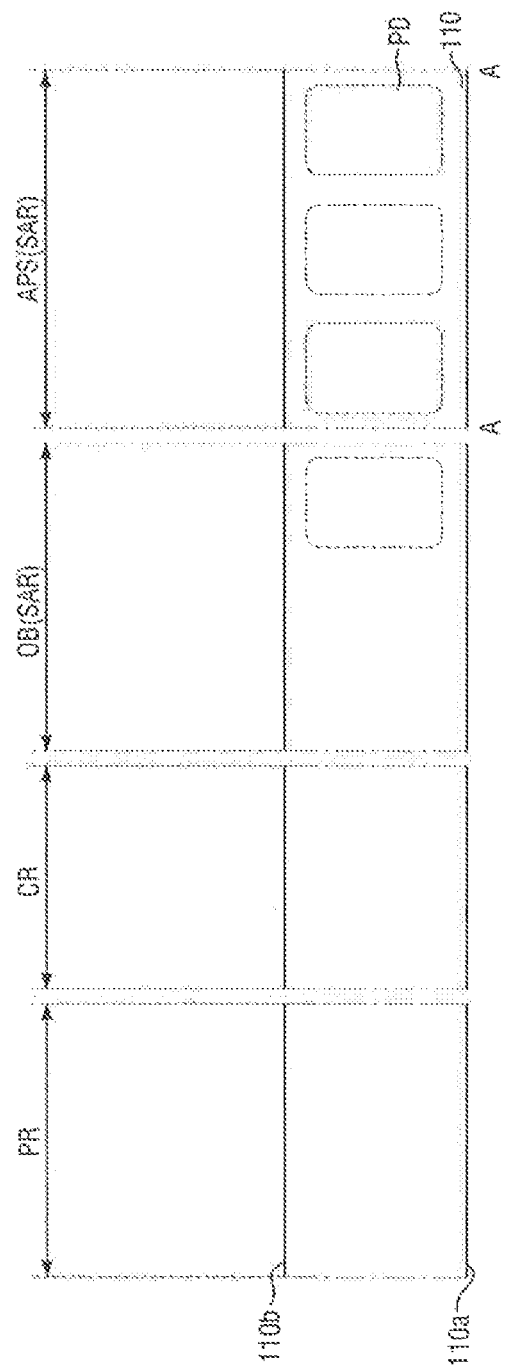
FIGS. 15, 16, 17, 18, 19, 20, 21, 22, 23, 24, 25, 26, 27 and 28 are views illustrating steps of a method of fabricating an image sensor according to exemplary embodiments of the inventive concept.

Referring to FIGS. 3 and 15, a first substrate 110 is provided.

The first substrate 110 may be a semiconductor substrate. The first substrate 110 may include a first surface 110a and a second surface 110b which are opposite each other. A plurality of unit pixels (e.g., PX1 through PX9 of FIG. 3) may be formed in the first substrate 110 of a sensor array region SAR. A photoelectric conversion layer PD may be formed in each of the unit pixels.

Figure 16:
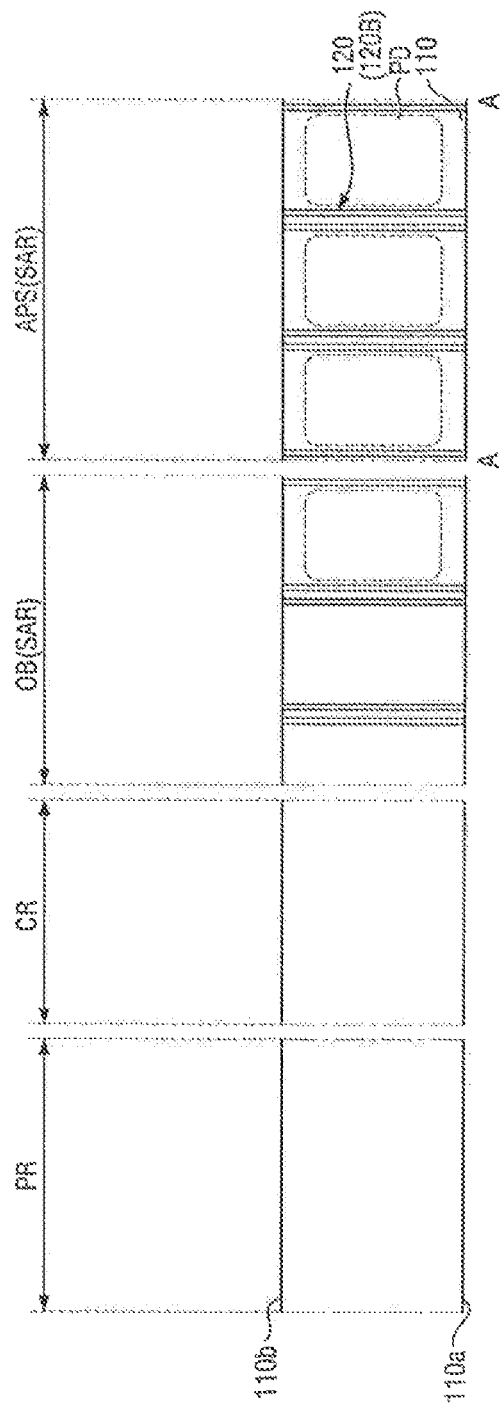

Referring to FIGS. 3 and 16, a pixel separation pattern 120 is formed in the first substrate 110.

The pixel separation pattern 120 may be formed in the first substrate 110 of the sensor array region SAR. For example, a deep trench (e.g., the first trench 120*t* of FIGS. 5 and 7A) may be formed in the first substrate 110 by performing an etching process on the second surface 110*b* of the first substrate 110. Then, a pixel separation pattern 120 may be formed to fill the first trench 120*t*.

The first trench 120*t* may be formed in a grid shape in a plan view to separate a plurality of pixels (e.g., PX1 through PX9 of FIG. 3) from each other. For example, a part of the pixel separation pattern 120 may be formed in first regions I to separate pixels (e.g., the first pixel PX1 and the second pixel PX2 or the second pixel PX2 and the third pixel PX3) arranged along the first direction X. In addition, the other part of the pixel separation pattern 120 may be formed in second regions II to separate pixels (e.g., the first pixel PX1 and the fourth pixel PX4 or the fourth pixel PX4 and the seventh pixel PX7) arranged along the second direction Y.

Figure 17:
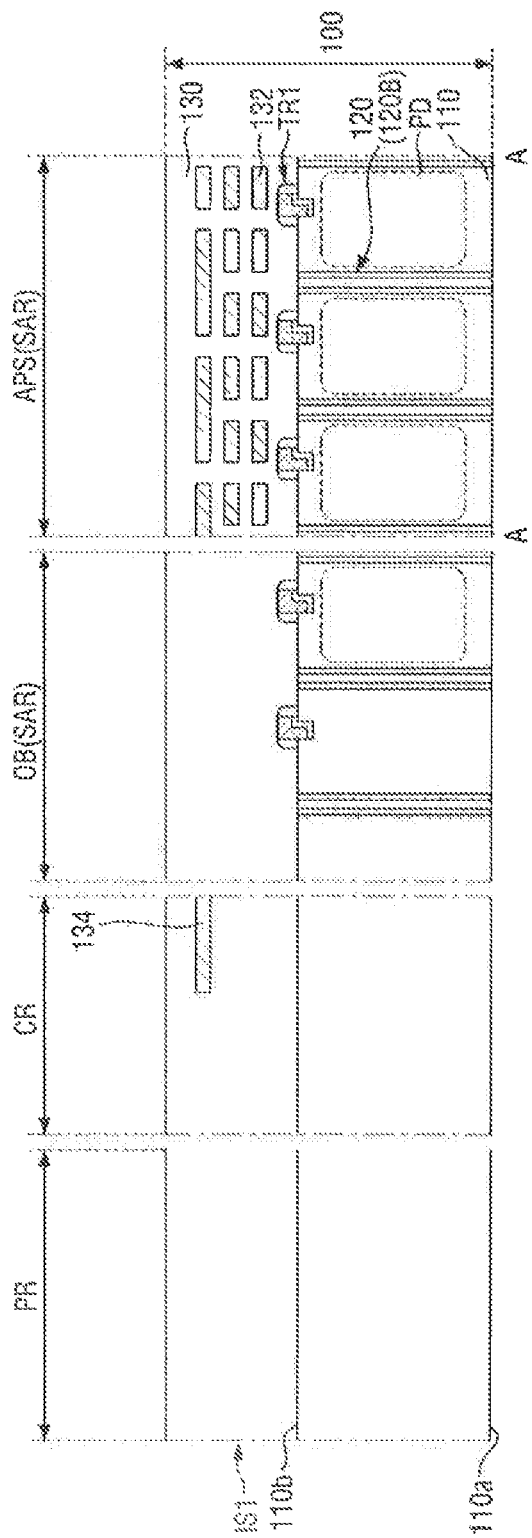

Referring to FIGS. 3 and 17, first electronic devices TR1 and a first wiring structure IS1 are formed on the second surface 110*b* of the first substrate 110. Accordingly, a first substrate structure 100 including the first substrate 110, the first electronic devices TR1, and the first wiring structure IS1 may be formed.

The first electronic devices T1 may be connected to the photoelectric conversion layers PD to form various transistors for processing electrical signals.

The first wiring structure IS1 may include a first inter-wiring insulating layer 130 and a plurality of wirings 132 and 134 formed in the first inter-wiring insulating layer 130. For example, the first wiring structure IS1 may include first wirings 132 in the sensor array region SAR and a second wiring 134 in a connection region CR.

Figure 18:
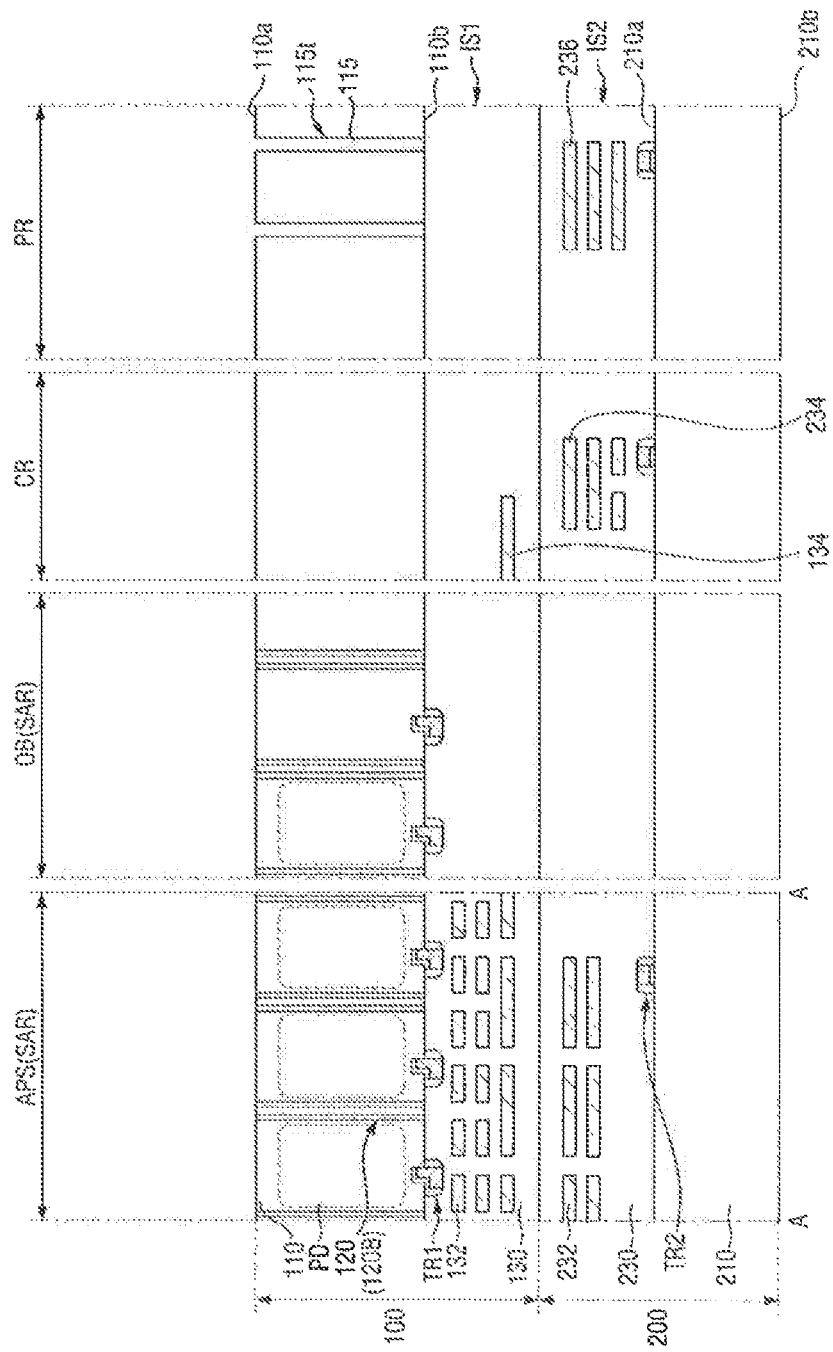

Referring to FIGS. 3 and 18, the first substrate structure 100 is attached onto a second substrate structure 200.

The second substrate structure 200 may include a second substrate 210 and a second wiring structure IS2.

The second wiring structure IS2 may include a second inter-wiring insulating layer 230 and a plurality of wirings 232, 234 and 236 formed in the second inter-wiring insluting layer 230. For example, the second wiring structure IS2 may include third wirings 232 in the sensor array region SAR, a fourth wiring 234 in the connection region CR, and a fifth wiring 236 in a pad region PR.

In some exemplary embodiments of the inventive concept, the first substrate structure 100 and the second substrate structure 200 may be attached to each other such that the second surface 110*b* of the first substrate 110 and a third surface 210*a* of the second substrate 210 face each other. For example, as illustrated in the drawings, an upper surface of the second wiring structure IS2 may be attached to a bottom surface of the first wiring structure IS1.

Figure 19:
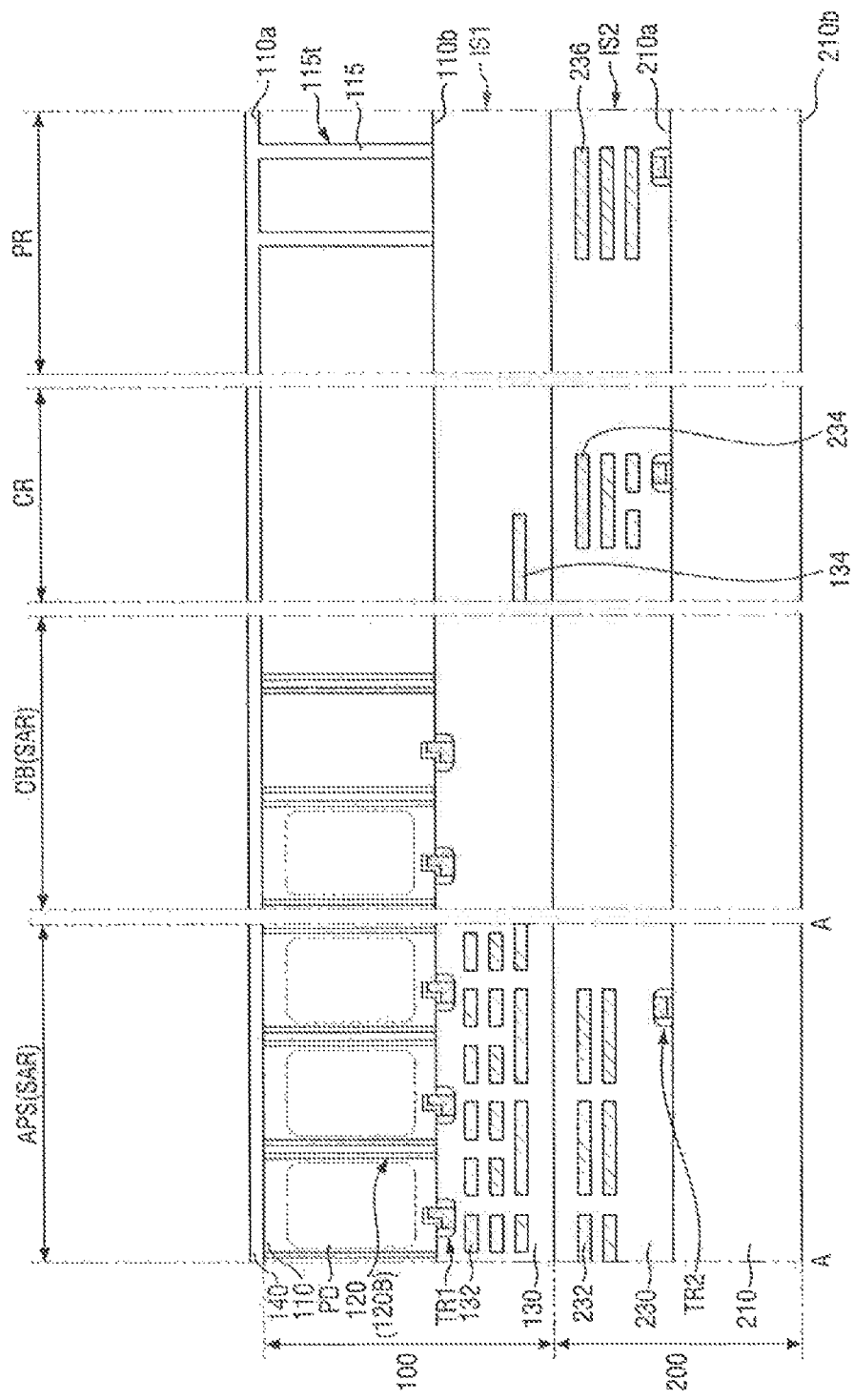
Figure 20:
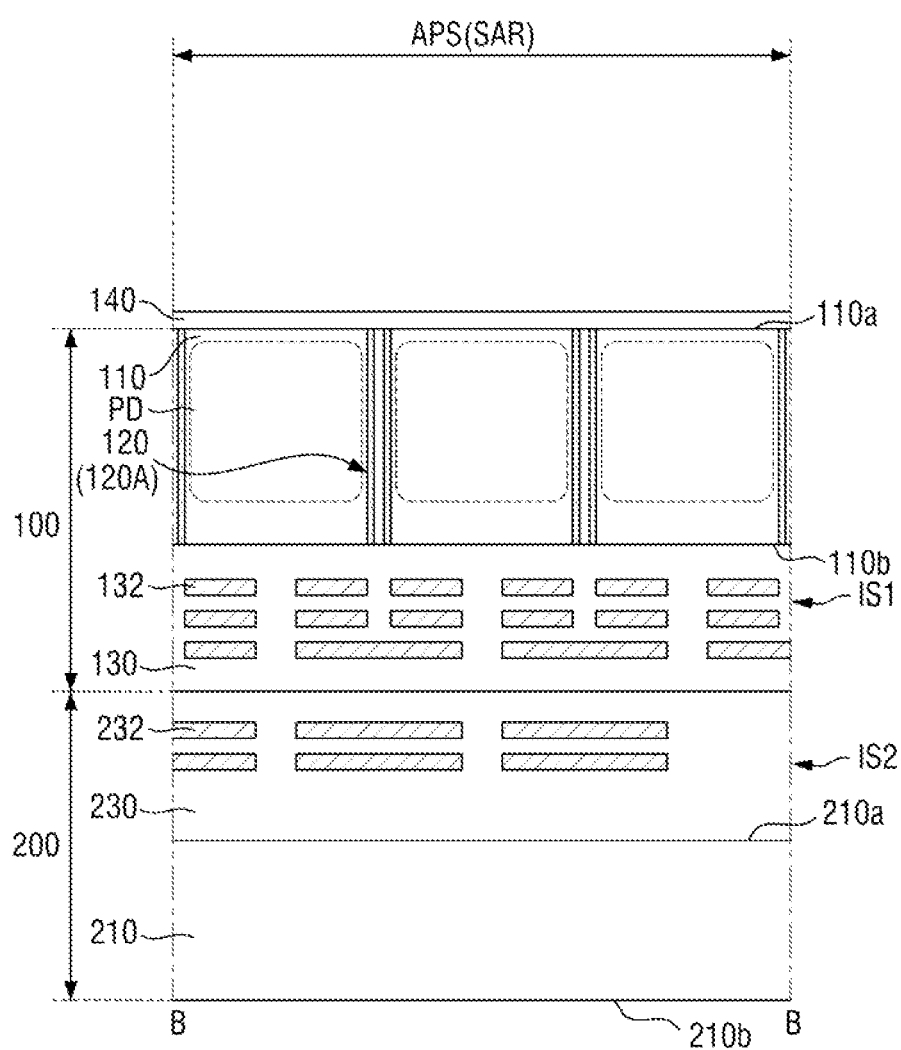

Referring to FIGS. 3, 19 and 20, a surface insulating layer 140 is formed on the first surface 110*a* of the first substrate 110.

The surface insulating layer 140 may extend along the first surface 110*a* of the first substrate 110. The surface insulating layer 140 may include an insulating material. For example, the surface insluting layer 140 may include, but is not limited to, at least one of silicon oxide, silicon nitride, silicon oxynitride, aluminum oxide, hafnium oxide, and combinations of the same. In some exemplary embodiments of the inventive concept, the surface insulating layer 140 may be formed as a multilayer. For example, the surface insulating layer 140 may have five layers as shown in FIG. 5.

In some exemplary embodiments of the inventive concept, a seventh trench 115*t* may be formed in the first substrate 110 before the surface insulting layer 140 is formed. Although the seventh trench 115*t* is formed only in the pad region PR in the drawings, this is merely an example. For example, the seventh trench 115*t* may be formed in a light blocking region OB or the connection region CR. A part of the surface insulating layer 140 may fill the seventh trench 115*t*. Accordingly, a device isolation pattern 115 may be formed in the seventh trench 115*t*.

Figure 21:
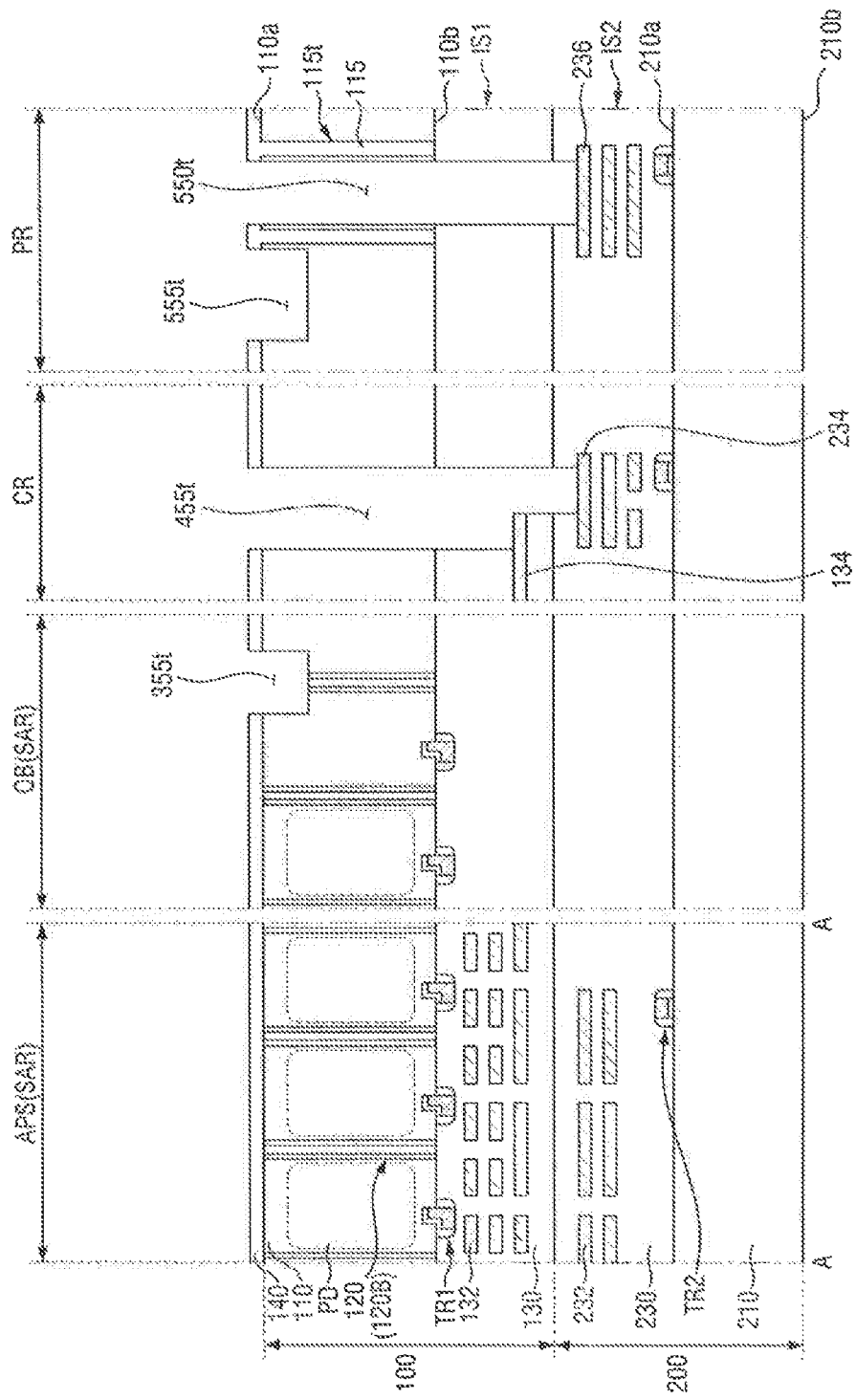
Figure 22:
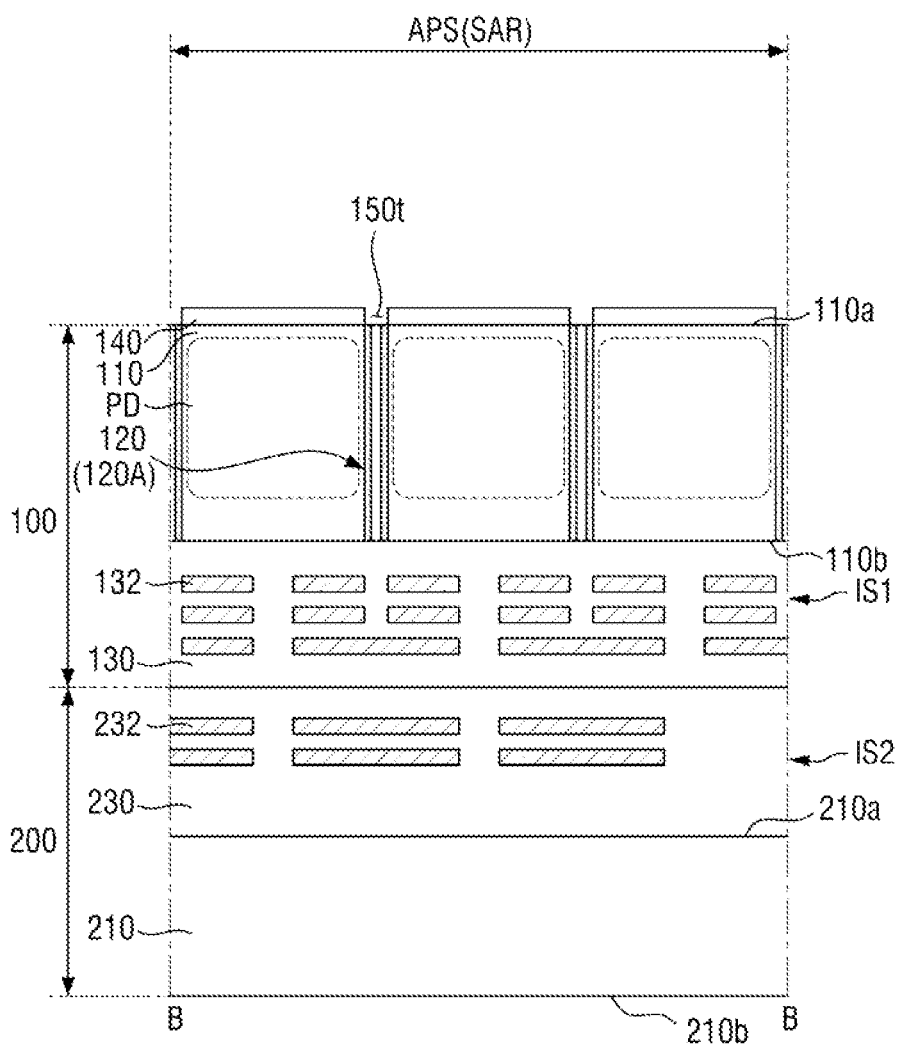

Referring to FIGS. 3, 21 and 22, second trenches 150*t* are formed in the surface insulating layer 140.

The second trenches 150*t* may overlap a first portion 120A of the pixel separation pattern 120. In some exemplary embodiments of the inventive concept, the second trenches 150*t* may overlap grid points of the pixel separation pattern 120 formed in a grid shape. For example, the second trenches 150*t* may be formed in the surface insulating layer 140 of intersection regions III. In some exemplary embodiments of the inventive concept, the second trenches 150*t* may expose the first portion 120A of the pixel separation pattern 120 formed in a grid shape.

In some exemplary embodiments of the inventive concept, third, fourth, fifth and sixth trenches 355*t*, 455*t*, 550*t* and 555*t* may be formed in the surface insulating layer 140. The forming of the third through sixth trenches 355*t*, 455*t*, 550*t* and 555*t* may be performed in-situ with the forming of the second trenches 150*t*. The forming of the third through sixth trenches 355*t*, 455*t*, 550*t* and 555*t* may be performed before the forming of the second trenches 150*t* or after the forming of the second trenches 150*t*.

Figure 23:
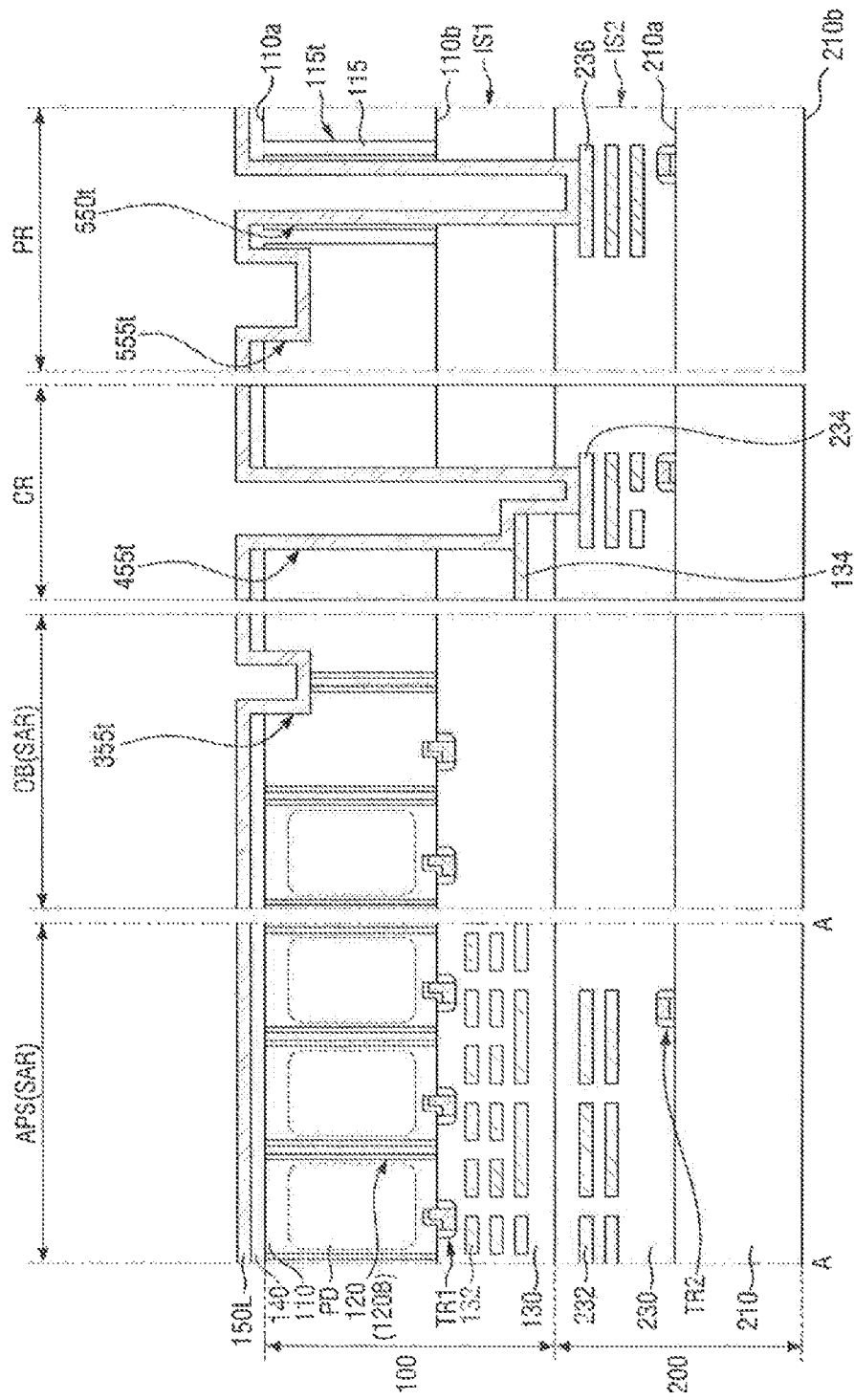
Figure 24:
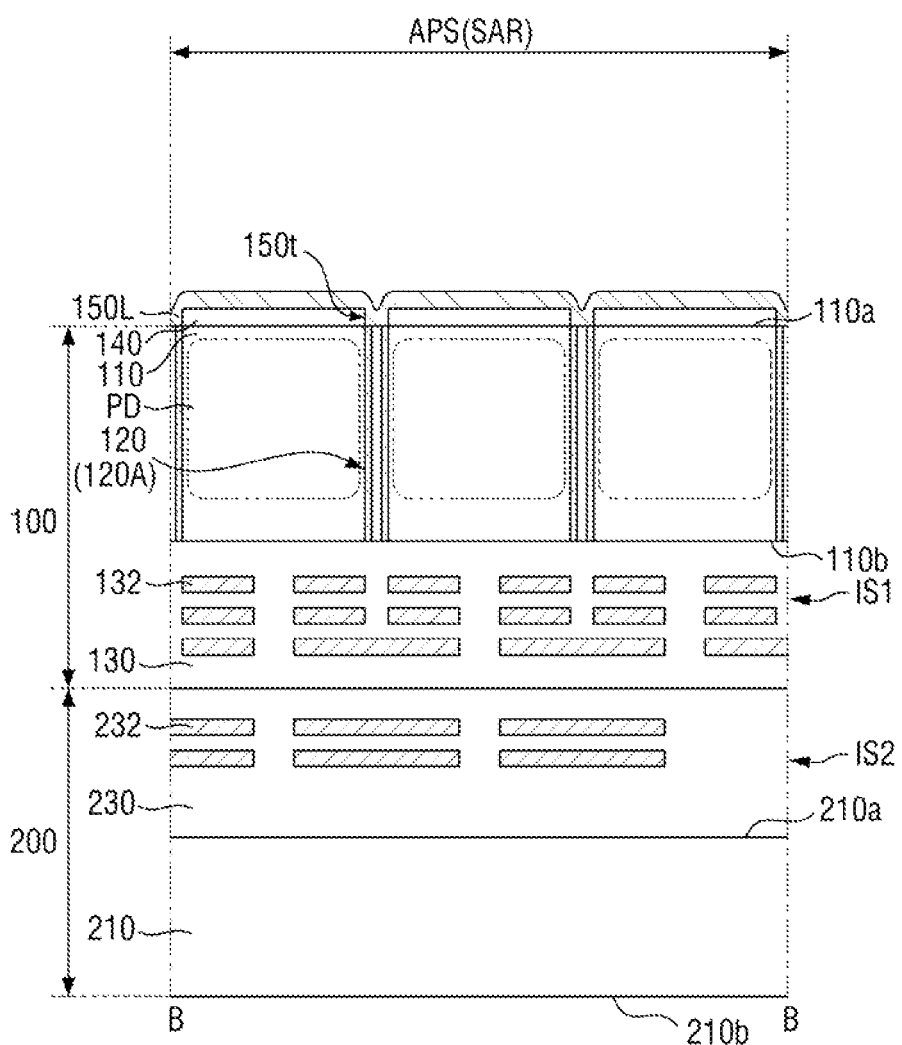

Referring to FIGS. 3, 23 and 24, a fourth conductive layer 150L is formed in the second through sixth trenches 150*t*, 355*t*, 455*t*, 550*t* and 555*t*.

The fourth conductive layer 150L may be formed on the surface insulating layer 140. For example, the fourth conductive layer 150L may extend along an upper surface of the surface insulating layer 140 and profiles of the second through sixth trenches 150*t*, 355*t*, 455*t*, 550*t* and 555*t*.

In some exemplary embodiments of the inventive concept, the fourth conductive layer 150L may be formed as a multilayer. In some exemplary embodiments of the inventive concept, the fourth conductive layer 150L may include a barrier conductive layer and a metal conductive layer. The barrier conductive layer may include, for example, at least one of titanium (Ti), titanium nitride (TiN), tantalum (Ta), tantalum nitride (TaN), and combinations of the same. The metal conductive layer may include, for example, at least one of tungsten (W), aluminum (Al), copper (Cu), and combinations of the same. For example, the fourth conductive layer 150L may include a titanium (Ti) layer, a titanium nitride (TiN) layer, and a tungsten (W) layer stacked sequentially.

Figure 25:
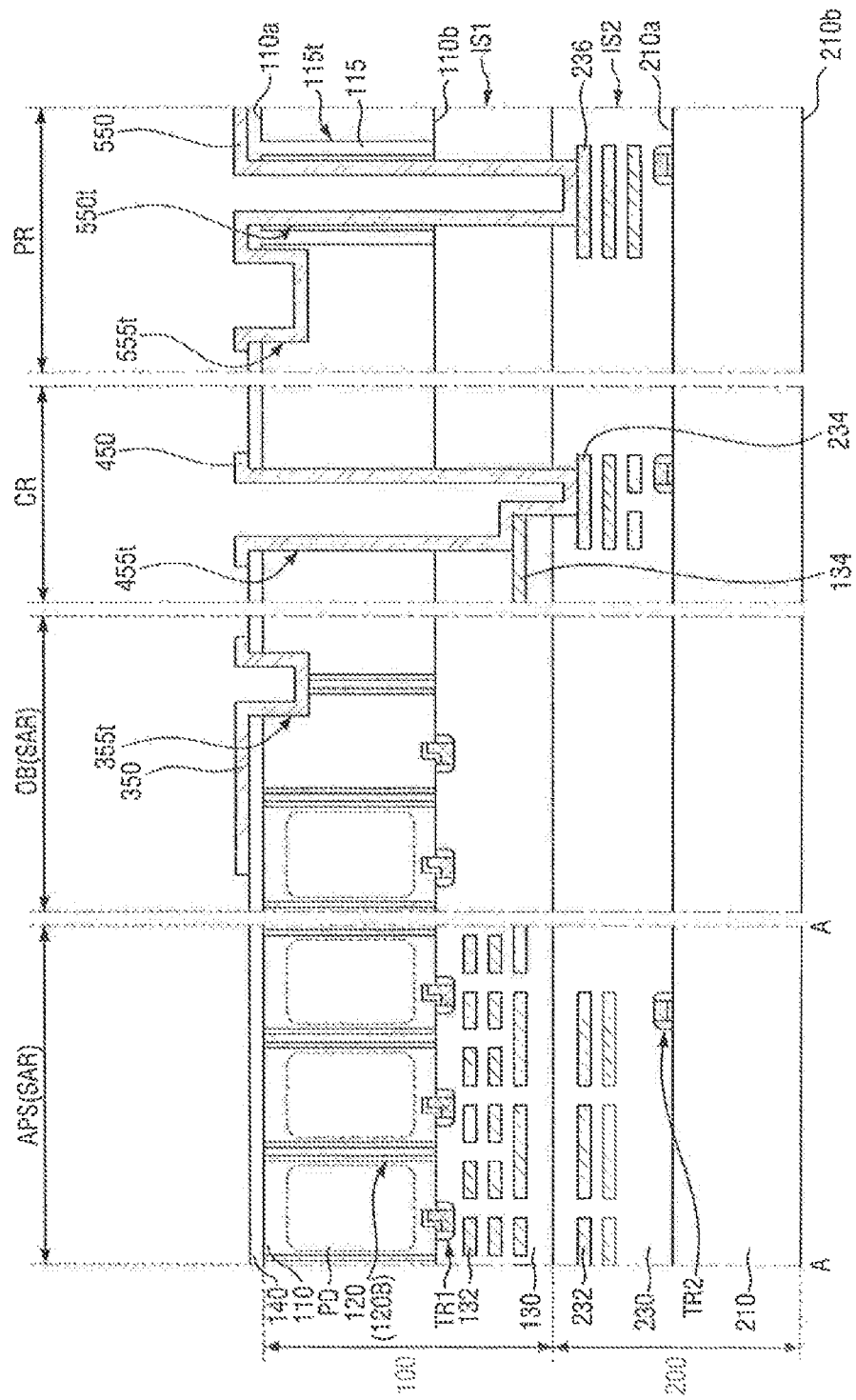
Figure 26:
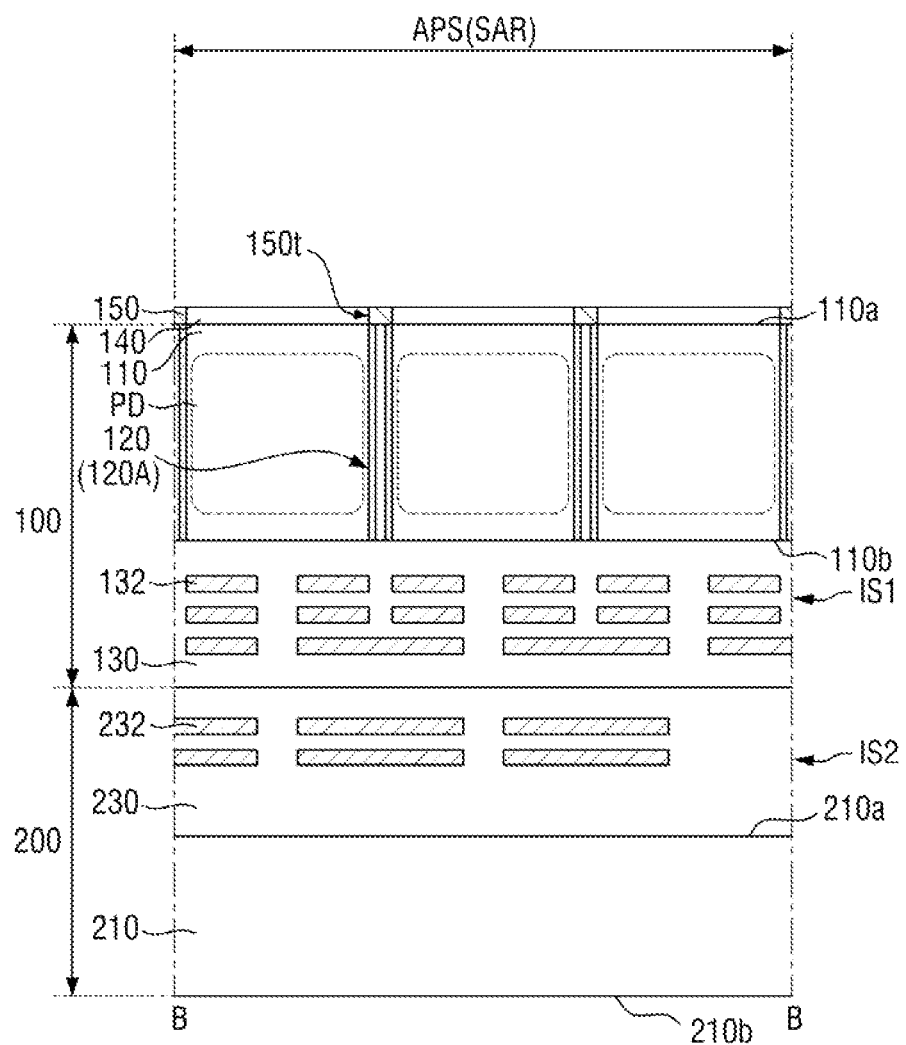

Referring to FIGS. 3, 25 and 26, conductor contacts 150 are formed in the surface insulating layer 140.

For example, the fourth conductive layer 150L may be patterned to form the conductor contacts 150 filling the second trenches 150*t*. Accordingly, the conductor contacts 150 may overlap the first portion 120A of the pixel separation pattern 120. In some exemplary embodiments of the inventive concept, the conductor contacts 150 may overlap the grid points of the pixel separation pattern 120 formed in a grid shape.

In some exemplary embodiments of the inventive concept, the fourth conductive layer 150L may be patterned to form first, second and third connection structures 350, 450 and 550 in the third through sixth trenches 355*t*, 455*t*, 550*t* and 555t. The forming of the first through third connection structures 350, 450 and 550 may be performed in-situ with the forming of the conductor contacts 150. The forming of the first through third connection structures 350, 450 and 550 may also be performed before the forming of the conductor contacts 150 or after the forming of the conductor contacts 150.

Figure 27:
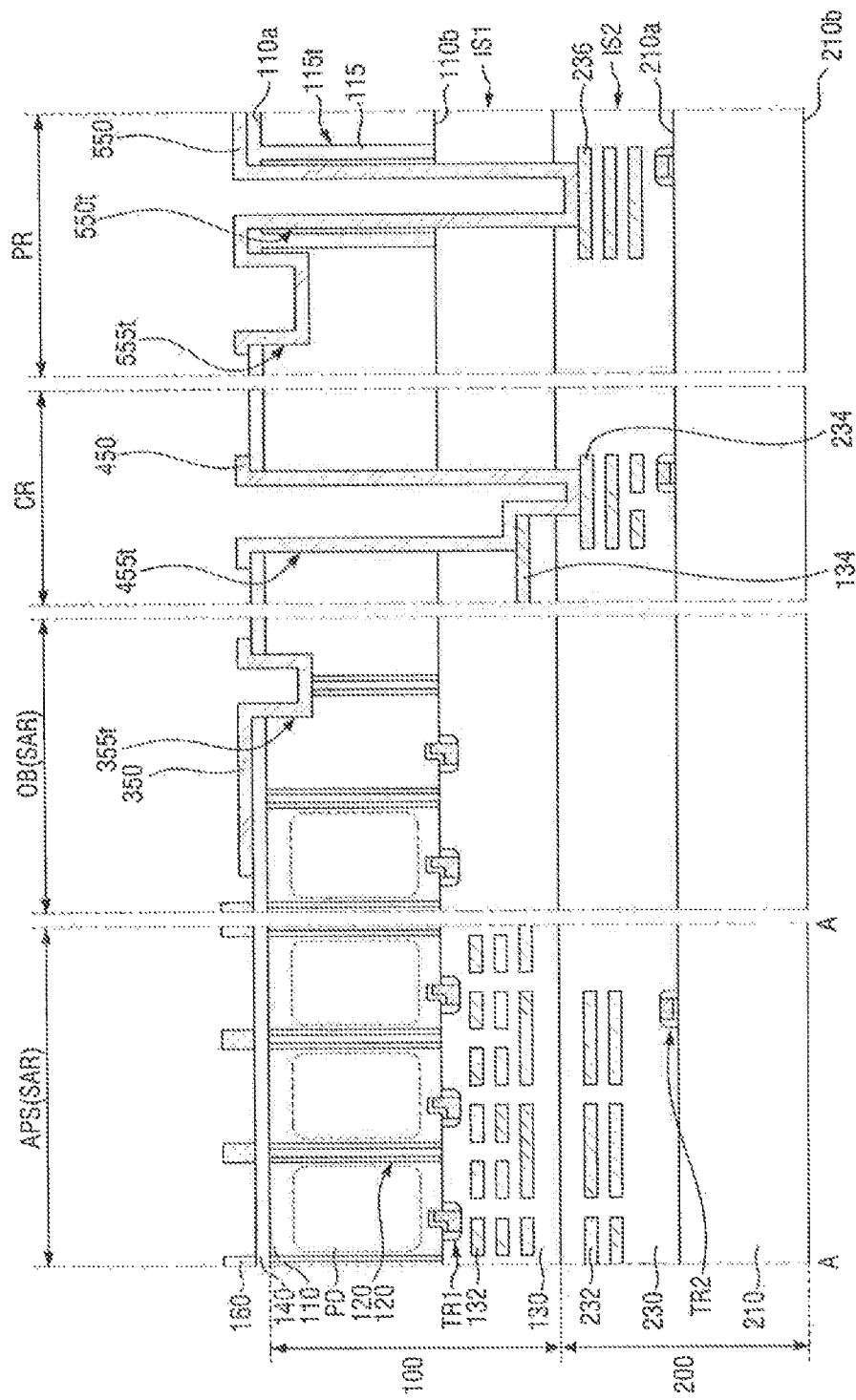
Figure 28:
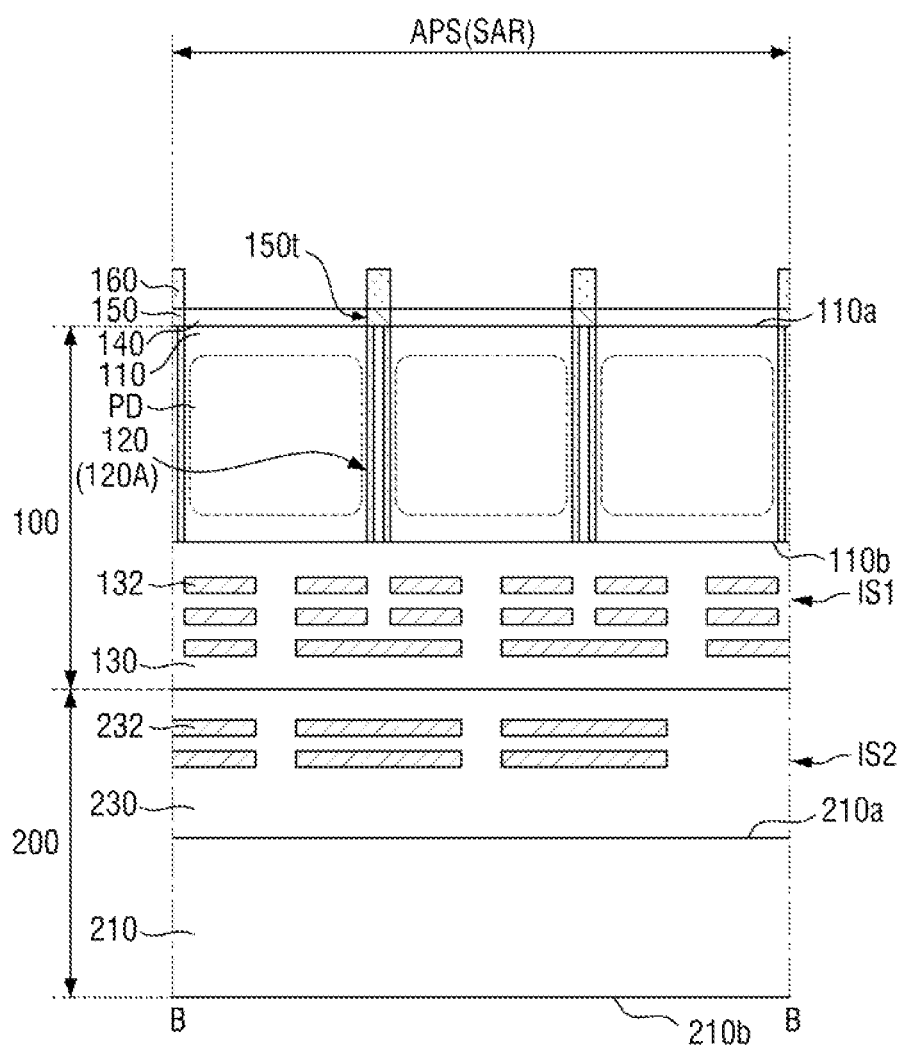

Referring to FIGS. 3, 27 and 28, a grid pattern 160 is formed on the surface insulating layer 140 and the conductor contacts 150.

The grid pattern 160 may be formed in a grid shape in a plan view. The grid pattern 160 may overlap the pixel separation pattern 120. For example, a part of the grid pattern 160 may be formed in the first regions I, and the other part of the grid pattern 160 may be formed in the second regions II. Accordingly, in some exemplary embodiments of the inventive concept, the conductor contacts 150 may overlap grid points of the grid pattern 160 formed in a grid shape.

The grid pattern 160 may include a low refractive index material having a refractive index lower than that of silicon (Si). For example, the grid pattern 160 may include, but is not limited to, at least one of silicon oxide, aluminum oxide, tantalum oxide, and combinations of the same.

Next, referring to FIGS. 3, 4 and 6, a first protective layer 165, color filters 170, microlenses 180, a second protective layer 185, a first filling insulating layer 460, a second filling insulating layer 560, a third color filter 170C, and a third protective layer 380 are formed on the surface insulating layer 140 and the grid pattern 160.

Accordingly, the image sensor described above with reference to FIGS. 3 through 7H may be fabricated.

According to an exemplary embodiment of the inventive concept, there is provided a method of fabricating an image sensor, the method including: providing a first substrate 110 which comprises a plurality of pixels PX1-PX9, each pixel comprising a photoelectric conversion layer PD, and the first substrate includes a first surface 110a and a second surface 110b opposite each other; forming a pixel separation pattern 120, which separates the pixels, in the first substrate with a grid shape; forming a surface insulting layer 140 along the first surface of the first substrate; forming conductor contacts 150 in the surface insulating layer to overlap grid points of the pixel separation pattern; and forming a grid pattern 160 on the surface insulating layer in a grid shape to overlap the pixel separation pattern.

While the inventive concept has been described with reference to exemplary embodiments thereof, it will be understood by those of ordinary skill in the art that various changes in form and details may be made thereto without departing from the spirit and scope of the inventive concept as set forth by the following claims.

What is claimed is:

1. An image sensor, comprising:
a substrate which comprises a first surface and a second surface opposite each other;
a plurality of pixels, each pixel comprising a photoelectric conversion layer in the substrate;
a pixel separation pattern disposed in the substrate and separating the pixels;
a first and second color filters on the second surface; and
a color filter separation structure including a first layer, a second layer on the first layer, and a third layer on the second layer; and a fourth layer on the third layer,
wherein the color filter separation structure is disposed between the first and second color filters, and
wherein the first layer includes a titanium nitride, the second layer includes a tungsten, the third layer includes a silicon oxide, and the fourth layer includes an aluminum oxide.

2. The image sensor of claim 1, wherein the pixel separation pattern contacts with the second surface and the first surface.

3. The image sensor of claim 2, wherein the fourth layer covers sidewalls of the third layer, and an upper surface of the third layer.

4. The image sensor of claim 1, wherein the pixel separation pattern contacts with the second surface and is spaced apart from the first surface.

5. The image sensor of claim 4, wherein the fourth layer covers sidewalls of the third layer, and an upper surface of the third layer.

6. The image sensor of claim 1, wherein the pixel separation pattern has a first width in a first direction on the second surface, and
wherein the first layer has a second width in the first direction on the second surface, and
wherein the second width is smaller than the first width.

7. The image sensor of claim 1, wherein the pixel separation pattern includes an aluminum oxide.

8. The image sensor of claim 1, wherein the second layer has a first height in a second direction and the third layer has a second height in the second direction,
wherein the first height is shorter than the first height, and
wherein the second direction is a direction extending from the first surface to the second surface.

9. The image sensor of claim 1, further comprising an aluminum oxide layer between the first layer and the second surface.

10. The image sensor of claim 9, wherein the third layer has a first height in a second direction and the fourth layer has a second height in the second direction,
wherein the second height is shorter than the first height, and
wherein the second direction is a direction extending from the first surface to the second surface.

11. The image sensor of claim 1, wherein the second layer directly contacts with the first layer,
wherein the third layer directly contacts with the second layer, and
wherein the fourth layer directly contacts with the third layer.

12. An image sensor, comprising:
a substrate which comprises a first surface and a second surface opposite each other;
a plurality of pixels, each pixel comprising a photoelectric conversion layer in the substrate;
a pixel separation pattern disposed in the substrate and separating the pixels;
an aluminum oxide layer disposed on the second surface;
a first and second color filters on the second surface; and
a color filter separation structure including a first layer, a second layer on the first layer, and a third layer on the second layer, and a fourth layer on the third layer,
wherein the color filter separation structure is disposed between the first and second color filters, and wherein the first layer includes a titanium nitride, the second layer includes a tungsten, the third layer includes a silicon oxide, and the fourth layer includes an aluminum oxide.

13. The image sensor of claim 12, wherein the fourth layer cover sidewalk of the third layer, and an upper surface of the third layer, and wherein the pixel separation pattern includes an aluminum oxide.

14. The image sensor of claim 12, wherein the second layer directly contacts with the first layer,
wherein the third layer directly contacts with the second layer, and
wherein the fourth layer directly contacts with the third layer.

\* \* \* \* \*